United States Patent
Park et al.

(10) Patent No.: US 12,293,782 B2
(45) Date of Patent: May 6, 2025

(54) CONVERTIBLE MEMORY DEVICE

(71) Applicant: SK hynix Inc., Gyeonggi-do (KR)

(72) Inventors: Gyeong Cheol Park, Gyeonggi-do (KR); Min Chul Sung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 131 days.

(21) Appl. No.: 18/186,960

(22) Filed: Mar. 21, 2023

(65) Prior Publication Data

US 2024/0144987 A1    May 2, 2024

(30) Foreign Application Priority Data

Oct. 28, 2022  (KR) .......................... 10-2022-0141163

(51) Int. Cl.
| | | |
|---|---|---|
| G11C 7/02 | (2006.01) | |
| G11C 11/22 | (2006.01) | |
| G11C 11/4076 | (2006.01) | |
| G11C 11/4078 | (2006.01) | |
| G11C 11/4091 | (2006.01) | |

(52) U.S. Cl.
CPC ...... *G11C 11/2273* (2013.01); *G11C 11/2255* (2013.01); *G11C 11/2259* (2013.01); *G11C 11/2295* (2013.01); *G11C 11/2297* (2013.01); *G11C 11/4076* (2013.01); *G11C 11/4078* (2013.01); *G11C 11/4091* (2013.01)

(58) Field of Classification Search
CPC ............ G11C 11/2273; G11C 11/2255; G11C 11/2259; G11C 11/2295; G11C 11/2297; G11C 11/4076; G11C 11/4078; G11C 11/4091; G11C 7/065; G11C 7/08; G11C 7/12; G11C 11/223; G11C 11/4094; G11C 11/221; G11C 11/401; G11C 29/021; G11C 29/026; G11C 29/028; G11C 14/0027; G11C 7/06; G11C 7/1051; G11C 29/006

USPC ........................................................ 365/207

See application file for complete search history.

(56) References Cited

U.S. PATENT DOCUMENTS

| | | | | |
|---|---|---|---|---|
| 6,510,071 | B2 * | 1/2003 | Oowaki .................. | G11C 11/22 365/189.11 |
| 6,909,626 | B2 * | 6/2005 | Torrisi .................... | G11C 11/22 365/189.09 |
| 8,223,527 | B2 | 7/2012 | Lee et al. | |
| 10,002,666 | B2 | 6/2018 | Kajigaya | |

(Continued)

OTHER PUBLICATIONS

Minchul Sung et al., Low Voltage and High Speed 1Xnm 1T1C FE-RAM with Ultra-Thin 5nm HZO, 2021 IEEE International Electron Devices Meeting (IEDM), Dec. 11-16, 2021, pp. 33.3.1-33.3.4.

*Primary Examiner* — Tha-O H Bui
(74) *Attorney, Agent, or Firm* — IP & T GROUP LLP

(57) ABSTRACT

A memory device includes a memory cell array including a plurality of memory cells; a sense amplifying circuit configured to sense data of the memory cells through bit lines, the sense amplifying circuit including: a first operational circuit configured to perform a first operation according to a first sensing control signal; and a second operational circuit configured to perform a second operation according to a second sensing control signal; and an operational monitoring circuit configured to provide the first sensing control signal or the second sensing control signal by monitoring whether at least some of the memory cells have a ferroelectric property.

22 Claims, 19 Drawing Sheets

(56) References Cited

U.S. PATENT DOCUMENTS 10,803,925 B2 10/2020 Kim et al.
2016/0086648 A1* 3/2016 Doi .................... G11C 11/2257
365/145

* cited by examiner

CONVERTIBLE MEMORY DEVICE

CROSS-REFERENCE TO RELATED APPLICATION

The present application claims the benefit of Korean Patent Application No. 10-2022-0141163, filed on Oct. 28, 2022, which is incorporated herein by reference in its entirety.

BACKGROUND

1. Field

Various embodiments of the present invention relate to a semiconductor design technology, and more particularly, to a convertible memory device capable of selectively operating with a nonvolatile memory and a volatile memory.

2. Description of the Related Art

Memory devices may be classified into volatile and nonvolatile memory devices. The non-volatile memory devices perform a read/write operation at a relatively lower speed than volatile memory devices but retain stored data even when a power supply is cut off. Accordingly, the non-volatile memory devices are frequently used in portable electronic devices for storing data which need to be retained regardless of whether or not power is supplied to the device.

Examples of the non-volatile memory devices include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FeRAM), and the like.

Among them, the FeRAM is attracting attention as a next-generation memory device due to a data processing speed equivalent to a dynamic random access memory (DRAM) and its nonvolatile characteristics that can retain data even when power is off. The FeRAM has a structure almost similar to the DRAM, and by using a ferroelectric with high residual polarization as a material of a cell capacitor, data is not erased even when its electric field is removed.

SUMMARY

Embodiments of the present invention are directed to a convertible memory device capable of selectively performing a volatile memory operation and a nonvolatile memory operation by monitoring states of cell capacitors of memory cells.

According to an embodiment of the present invention, a memory device includes a memory cell array including a plurality of memory cells; a sense amplifying circuit configured to sense data of the memory cells through bit lines, the sense amplifying circuit including: a first operational circuit configured to perform a first operation according to a first sensing control signal; and a second operational circuit configured to perform a second operation according to a second sensing control signal; and an operational monitoring circuit configured to provide the first sensing control signal or the second sensing control signal by monitoring whether at least some of the memory cells have a ferroelectric property.

According to an embodiment of the present invention, a memory device includes a memory cell array including a plurality of memory cells; a sense amplifying circuit configured to sense data of the memory cells through bit lines, the sense amplifying circuit including: a first operational circuit configured to perform a first operation according to a first sensing control signal; and a second operational circuit configured to perform a second operation according to a second sensing control signal; and an operational monitoring circuit configured to: generate access counting values for the respective memory cells by counting numbers of accesses to the respective memory cells based on a command and an address, and provide the first sensing control signal or the second sensing control signal based on the access counting values.

According to an embodiment of the present invention, a memory device includes a memory cell array including a plurality of memory cells; a sense amplifying circuit configured to sense data of the memory cells through bit lines, the sense amplifying circuit including: a first operational circuit configured to perform a first operation according to a first sensing control signal; and a second operational circuit configured to perform a second operation according to a second sensing control signal; and an operational monitoring circuit configured to: provide the first sensing control signal by detecting deteriorations of the memory cells based on the data, and provide the second sensing control signal by detecting fails of memory cells based on the data.

According to an embodiment of the present invention, an operating method of a memory device includes entering a first operation mode; generating access counting values for respective memory cells by counting numbers of accesses the respective memory cells based on a command and an address; exiting the first operation mode by initializing the access counting values when a predetermined number of ones among the access counting values individually exceed a first threshold value; entering a second operation mode; generating the access counting values by counting the numbers of accesses to the respective memory cells based on the command and the address; and exiting the second operation mode by initializing the access counting values when a predetermined number of ones among the access counting values individually exceed a second threshold value.

The first threshold value falls in a range of accesses to a DRAM cell, within which the DRAM cell is able to normally operate, and the second threshold value falls in a range of accesses to a FeRAM cell, within which the FeRAM cell is able to normally operate.

According to an embodiment of the present invention, an operating method of a memory device includes entering a first operation mode; detecting fails of respective memory cells based on data of the memory cells; exiting the first operation mode when a number of the fails reaches a preset first number; entering a second operation mode; detecting deteriorations of the respective memory cells based on the data of the memory cells; and exiting the second operation mode when a number of the deteriorations reaches a preset second number.

The detecting the fails includes detecting some bits of the data, the bits continuously staying in a specific logical state. The operating method further comprises decreasing a level of a bit line precharge voltage whenever the fail is detected until the number of the fails reaches the preset first number. The detecting the deteriorations includes detecting some bits of the data, the bits continuously staying in a specific logical state. The operating method further comprises decreasing a level of a bias voltage whenever the deterioration is detected until the number of the deteriorations reaches the preset second number.

According to an embodiment of the present invention, a memory device includes an array of cells each operable as a dynamic random access memory (DRAM) cell in a DRAM mode and as a ferroelectric RAM (FeRAM) cell in a FeRAM mode; and a control circuit configured to: access the array in any of the DRAM and FeRAM modes, and change the array between the DRAM and FeRA modes based on at least any of: a number of accesses to the array in each of the DRAM and FeRAM modes, and a consistent value status of data stored in at least a part of the array in each of the DRAM and FeRAM modes.

The control circuit changes the array from the FeRAM mode to the DRAM mode by removing, before sensing data from the array, a mismatch between bit lines coupled to the array. The control circuit changes the array from the DRAM mode to the FeRAM mode by applying, before sensing data from the array, a bias voltage to a part of bit lines coupled to the array.

According to embodiments of the present invention, the convertible memory device may be able to support various operation modes by supporting both of the volatile memory operation and the nonvolatile memory operation.

According to embodiments of the present invention, the convertible memory device may maximize the read/write cycle by increasing the life of the cell capacitor by switching between the volatile memory operation and the nonvolatile memory operation depending on the state of the cell capacitor. Accordingly, it is possible to improve the yield by reducing the failure due to the defective capacitor in the wafer test while increasing durability and data retention time of the device.

DETAILED DESCRIPTION

Figure 1:
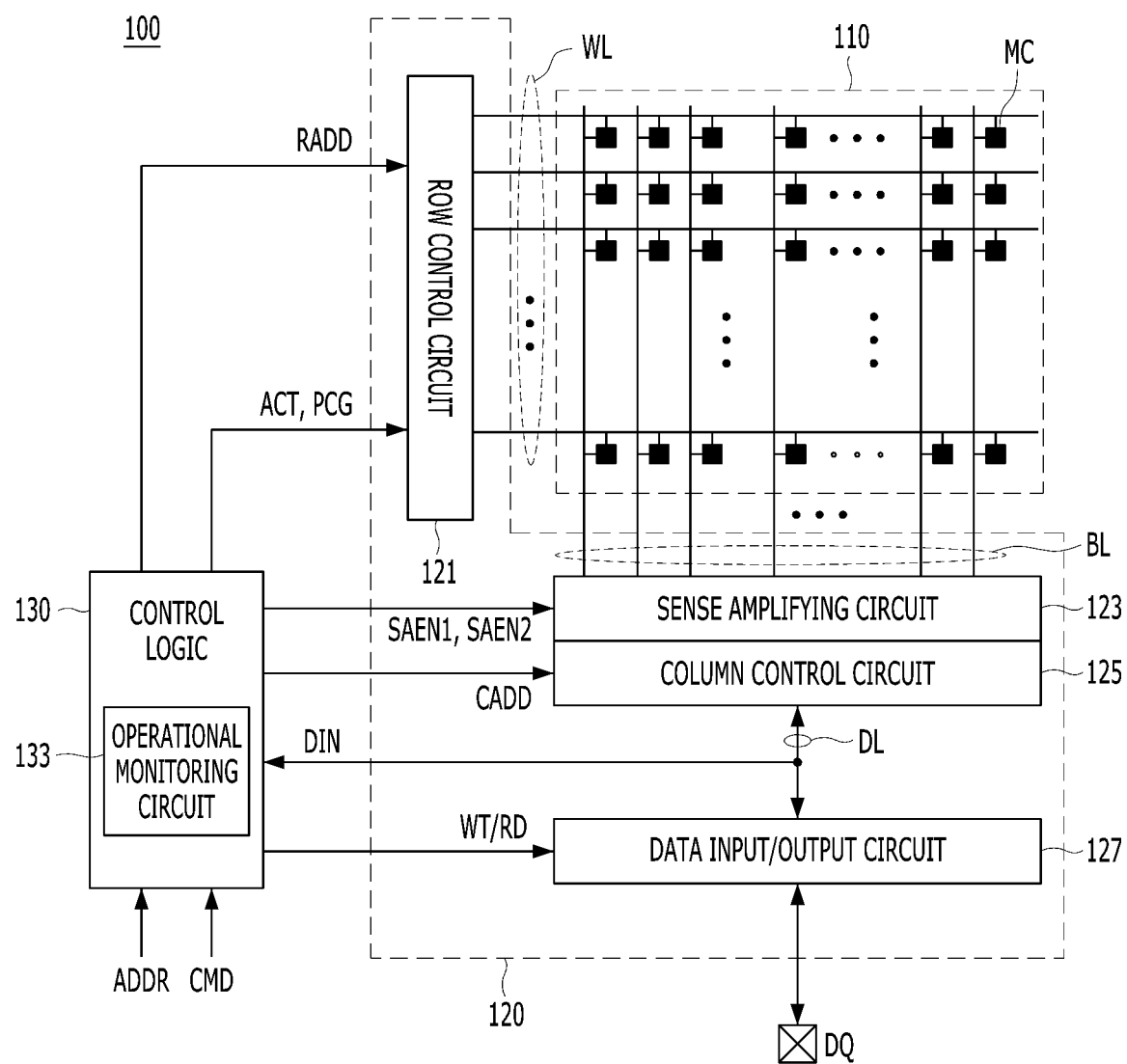
FIG. 1 is a block diagram illustrating a memory device in accordance with an embodiment of the present invention.

Specific structural and functional descriptions provided herein are directed to embodiments of the present disclosure. The present invention, however, is not limited to the embodiments described herein.

While embodiments are described in detail, the present invention is not limited to any specific detail. The present disclosure may be embodied in many different forms and should not be construed as being limited to any specific description. Rather, the present invention should be construed to cover not only the disclosed embodiments, but also various alternatives, modifications, equivalents, and other embodiments that fall within the spirit and scope of the present disclosure.

It will be understood that, although the terms "first", "second", etc. may be used herein to identify various elements, these elements should not be limited by these terms. These terms are only used to distinguish one element from another element that otherwise have the same or similar names. A first element in one instance could be termed a second element in another instance without departing from the teachings of the present disclosure.

It will be understood that when an element is referred to as being "coupled" or "connected" to another element, it can be directly coupled or connected to the other element or one or more intervening elements may be present therebetween. In contrast, it should be understood that when an element is referred to as being "directly coupled" or "directly connected" to another element, there are no intervening elements present. Other expressions that describe the relationship between elements, such as "between", "directly between", "adjacent to" or "directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that open ended terms, such as "comprise", "include", "have", etc., when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art, and should not be interpreted in an idealized or overly formal sense unless expressly so defined herein.

Detailed description of functions and structures well known to those skilled in the art may be omitted to avoid obscuring the subject matter of the present disclosure. This aims to omit unnecessary description to make the subject matter of the present disclosure clear.

Various embodiments of the present disclosure are described more fully below with reference to the accompanying drawings, in which embodiments of the present disclosure are shown, so that those skilled in the art can easily carry out and practice the present disclosure.

As a chip area of a memory device decreases, an amount of charge that may be accumulated in a cell capacitor is also decreasing. In order to minimize a reduction in the amount of charge of the cell capacitor, there is a method of increasing an aspect ratio of the cell capacitor as a diameter of the cell capacitor is reduced, but there is an instability that may be destroyed even with small stress. Another method is to use a material with the dielectric constant of the dielectric material in the cell capacitor as high as possible.

Accordingly, recently, zirconium oxide and hafnium oxide materials with high dielectric constants have been used to increase the storage capacity of cell capacitors of DRAMs. However, zirconium oxide and hafnium oxide materials also have a ferroelectric property or an anti-ferroelectric property. The anti-ferroelectric materials do not cause hysteresis of I-V Curve or C-V Curve within a driving voltage range of DRAM, so that the amount of charge required to read a logical state '0' or '1' may be clearly defined. However, even if it initially has a dielectric property, it may have a strong ferroelectric property over time. For example, in the process of going through many internal endurance cycles, applying a larger voltage for acceleration evaluation such as a wafer burn-in test, or changing the measurement temperature, the material of the cell capacitor changes to ferroelectric, resulting in hysteresis. This hysteresis causes a mismatch with the amount of charge for sensing in the logical state '0' or '1' and causes a failure. As a result, due to the ferroelectric, the sensing of data with a logic high level in the driving voltage range of the DRAM is not normal.

Meanwhile, the ferroelectric material is used as a cell capacitor of the FeRAM. The FeRAM may have no problem with hysteresis of I-V Curve or C-V Curve because the potential applied between a storage node and a plate during charge sharing is opposite to the potential between the storage node and the plate during rewriting after charge sharing. In an orthorhombic phase (o-phase) of hafnium oxide, which is mainly used as the ferroelectric material, domain pinning occurs due to charge trapping as oxygen vacancies increase. As a result, if the internal endurance cycling is performed above a certain level, it becomes increasingly difficult to distinguish between the logical states '0' and '1' with the FeRAM due to the decrease in residual polarization.

Hereinafter, a convertible memory device that may monitor whether a cell capacitor of a memory cell has a ferroelectric property and switch from a DRAM operation to a FeRAM operation, or from the FeRAM operation to the DRAM operation, will be described.

FIG. 1 is a block diagram illustrating a memory device 100 in accordance with an embodiment of the present invention.

Referring to FIG. 1, the memory device 100 may include a memory cell array 110, a peripheral circuit 120, and a control logic 130.

The memory cell array 110 may include a plurality of memory cells MC. Each of the memory cells MC may be arranged in a matrix form between a plurality of rows (i.e., word lines WL) and a plurality of columns (i.e., bit lines BL). According to an embodiment, each of the plurality of rows may be composed of at least one word line, at least one plate line and/or at least one source line. According to an embodiment, the memory cells MC may include a cell capacitor formed of a zirconium oxide or a hafnium oxide material having a high dielectric constant to increase storage capacity. The memory cells MC may have a ferroelectric property or an anti-ferroelectric property as a read or write operation is performed.

When the memory cells MC have ferroelectric, the memory cells MC have spontaneous electrical polarization, and thus have residual polarization or spontaneous polarization even if an electric field is removed. Accordingly, the memory device 100 including the memory cell array 110 in which the memory cells MC have the ferroelectric property may perform a nonvolatile memory operation (hereinafter, referred to as a FeRAM operation) according to the hysteresis of I-V Curve or C-V Curve. On the other hand, when the memory cells MC are the anti-ferroelectric property, the hysteresis of I-V Curve or C-V Curve does not occur within a driving voltage range of a DRAM, so that an amount of charge required to read logical states '0' and '1' may be clearly defined. Accordingly, the memory device 100 including the memory cell array 110 in which the memory cells MC have the anti-ferroelectric property may perform a volatile memory operation (hereinafter, referred to as a DRAM operation). Structures of the memory cells MC will be described in detail with reference to FIGS. 2A to 2C.

The peripheral circuit 120 may drive the memory cell array 110 under the control of the control logic 130. For example, the peripheral circuit 120 may select specific memory cells of the memory cell array 110 by applying various voltages to the word lines WL and the bit lines BL under the control of the control logic 130, and perform a normal operation such as a read or write operation to the selected memory cells. That is, the normal operation may include an access operation of accessing the selected memory cells according to the driving voltages applied to the memory cells through the word lines WL and the bit lines BL during the read or write operation.

More specifically, the peripheral circuit 120 may include a row control circuit 121, a sense amplifying circuit 123, a column control circuit 125, and a data input/output circuit 127.

The row control circuit 121 may be coupled to the memory cells MC of the memory cell array 110 through the word lines WL. The row control circuit 121 may operate in response to the control of the control logic 130. The row control circuit 121 may receive a row address RADD, an active command ACT, and a precharge command PCG from the control logic 130. The row control circuit 121 may decode the row address RADD to select one of the word lines WL. The row control circuit 121 may activate the selected word line according to the active command ACT and deactivate the activated word line according to the precharge command PCG. For example, the row control circuit 121 may apply a high voltage VPP higher than a power supply voltage (VDD) level to the selected word line to activate the selected word line. According to an embodiment, the row control circuit 121 may include an address buffer, a row decoder, a voltage generation circuit, and the like. Meanwhile, the row control circuit 121 may additionally drive a source line or a plate line of the memory cell array 110 under the control of the control logic 130.

The sense amplifying circuit 123 may be coupled to the memory cells MC of the memory cell array 110 through the bit lines BL. The sense amplifying circuit 123 may operate in response to the control of the control logic 130. The sense amplifying circuit 123 may receive a first sensing control signal SAEN1 and a second sensing control signal SAEN2 from the control logic 130. The sense amplifying circuit 123 may include a plurality of bit line sense amplifiers coupled to a pair of bit lines BLT and BLB, respectively. Each of the bit line sense amplifiers may sense and amplify a voltage difference between a positive bit line BLT and a negative bit line BLB, in response to the first sensing control signal SAEN1 and the second sensing control signal SAEN2.

In an embodiment, each of the bit line sense amplifiers may include an operation circuit for a first memory (hereinafter, referred to as a first operational circuit) that performs a first operation according to the first sensing control signal SAEN1, and an operation circuit for a second memory (hereinafter, referred to as a second operational circuit) that performs a second operation according to the second sensing control signal SAEN2. In this case, the first operation may correspond to a DRAM operation including an offset cancellation operation for DRAM to remove a mismatch between the positive bit line BLT and the negative bit line BLB before a sensing operation, and the first operational circuit may include an offset cancellation circuit. In addition, the second operation may correspond to a FeRAM operation including a recovery operation for FeRAM that applies a bias voltage to one of the positive bit line BLT and the negative bit line BLB before the sensing operation, and the second operational circuit may include a bias circuit. A detailed configuration and operation of the sense amplifying circuit 123 will be described with reference to FIGS. 3 to 11.

The column control circuit 125 may operate in response to the control of the control logic 130. The column control circuit 125 may receive a column address CADD from the control logic 130. The column control circuit 125 may decode the column address CADD to select some bit lines among the bit lines BL and transmit data DIN between the selected bit lines and the data input/output circuit 127. The column control circuit 125 may exchange data DIN with the data input/output circuit 127 through data lines DL. For example, the column control circuit 125 may transfer data DIN read from the bit lines BL to the data input/output circuit 127 through the data lines DL, or transfer data DIN provided from the data input/output circuit 127 through the data lines DL to the bit lines BL. According to an embodiment, the column control circuit 122 may include a column decoder.

The data input/output circuit 127 may exchange data with an external device (e.g., a memory controller or a test device) through a data pad DQ. The data input/output circuit 127 may operate in response to the control of the control logic 130. The data input/output circuit 127 may receive a read command RD or a write command WT from the control logic 130. During the read operation, the data input/output circuit 127 may output data transmitted through the data lines DL to the data pad DQ in response to the read command RD. During the write operation, the data input/output circuit 127 may receive data provided from the external device through the data pad DQ in response to the write command WT.

The control logic 130 may control all operations of the memory device 100. The control logic 130 may receive a command CMD and an address ADDR from the external device. The control logic 130 may generate the row address RADD, the column address CADD, the active command ACT, the precharge command PCG, the read command RD, the write command WT, the first sensing control signal SAEN1, and the second sensing control signal SAEN2 to control the peripheral circuit 120. The control logic 130 may buffer and decode the address ADDR and output the row address RADD and the column address CADD. The control logic 130 may decode the command CMD to generate the active command ACT, the precharge command PCG, the read command RD, the write command WT, the first sensing control signal SAEN1, and the second sensing control signal SAEN2.

According to an embodiment, the control logic 130 may include an operational monitoring circuit 133. The operational monitoring circuit 133 may generate the first sensing control signal SAEN1 and the second sensing control signal SAEN2 activated in response to the active command ACT and deactivated in response to the precharge command PCG, and may provide the first sensing control signal SAEN1 or the second sensing signal by monitoring whether at least some of the memory cells MC have the ferroelectric property or the anti-ferroelectric property. Accordingly, the control logic 130 may control the sense amplifying circuit 123 to perform the DRAM operation by monitoring a case in which at least some of the memory cells MC have the anti-ferroelectric property, and may perform the FeRAM operation by monitoring a case in which at least some of the memory cells MC have the ferroelectric property. The detailed configuration and operation of the control logic 130 will be described with reference to FIGS. 12 to 16.

Figure 2A:
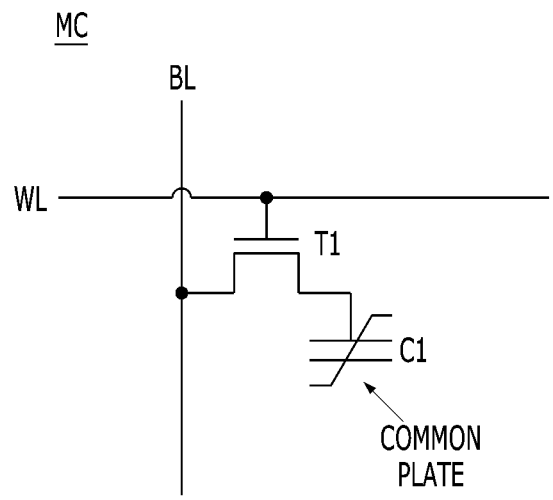
FIGS. 2A to 2C are diagrams illustrating a structure of a memory cell of FIG. 1 in accordance with an embodiment of the present invention.
Figure 2B:
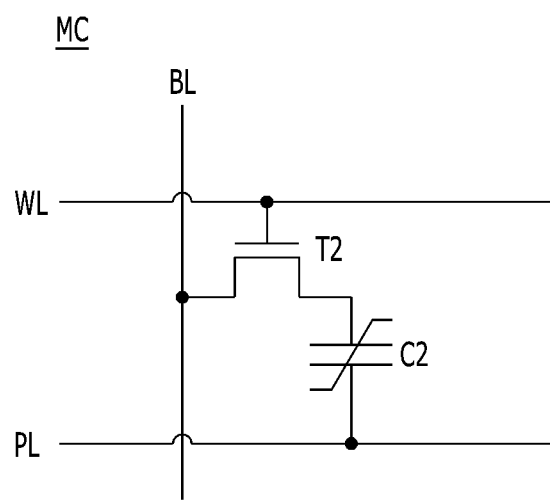
Figure 2C:
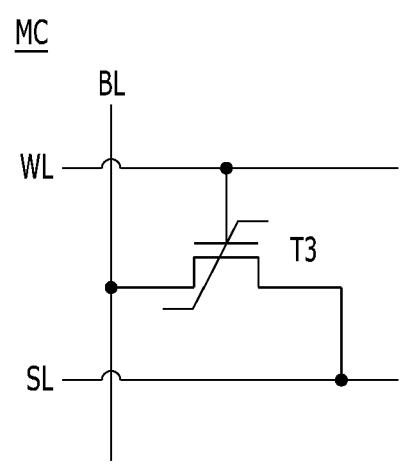

FIGS. 2A to 2C are diagrams illustrating a structure of a memory cell MC of FIG. 1 in accordance with an embodiment of the present invention.

Referring to FIG. 2A, the memory cell MC may include an access transistor T1 and a cell capacitor C1. That is, each memory cell MC has a configuration of 1T/1C in which a cell storing 1-bit is composed of one transistor and one capacitor. The cell capacitor C1 may include a first electrode coupled to a common plate. The access transistor T1 may be coupled between a second electrode of the cell capacitor C1 and a bit line BL and may have a gate coupled to a word line WL.

A dielectric material based on silicon, hafnium oxide, zirconium oxide, and hafnium zirconium oxide may be formed between the first and second electrodes of the cell capacitor C1. Alternatively, a dielectric material based on a Perovskite-based piezoelectric material such as BaTiO3, SrTiO3, PbZrTiO, etc. may be formed between the first and second electrodes of the cell capacitor C1. The cell capacitor C1 may have a ferroelectric property or an antiferroelectric property as a read or a write operation is performed.

Referring to FIG. 2B, the memory cell MC may include an access transistor T2 and a cell capacitor C2. Like FIG. 2A, the memory cell MC has a configuration of 1T/1C. The cell capacitor C2 may include the same configuration as the cell capacitor C1 of FIG. 2A. The cell capacitor C2 may include a first electrode coupled to a plate line PL. The access transistor T2 may be coupled between a second electrode of the cell capacitor C2 and a bit line BL and may have a gate coupled to a word line WL. In this case, the row control circuit 121 may control a row line consisting of a word line WL and a plate line PL per one memory cell. The memory cell MC illustrated in FIG. 2B may have independent plates but may have an array shape coupled through a plate line PL.

Referring to FIG. 2C, the memory cell MC may include a single transistor T3 coupled between a source line SL and a bit line BL and having a gate coupled to a word line WL. A dielectric material in a gate of the memory cell MC may be substantially the same as that of the cell capacitor C1 of FIG. 2A.

Figure 3:
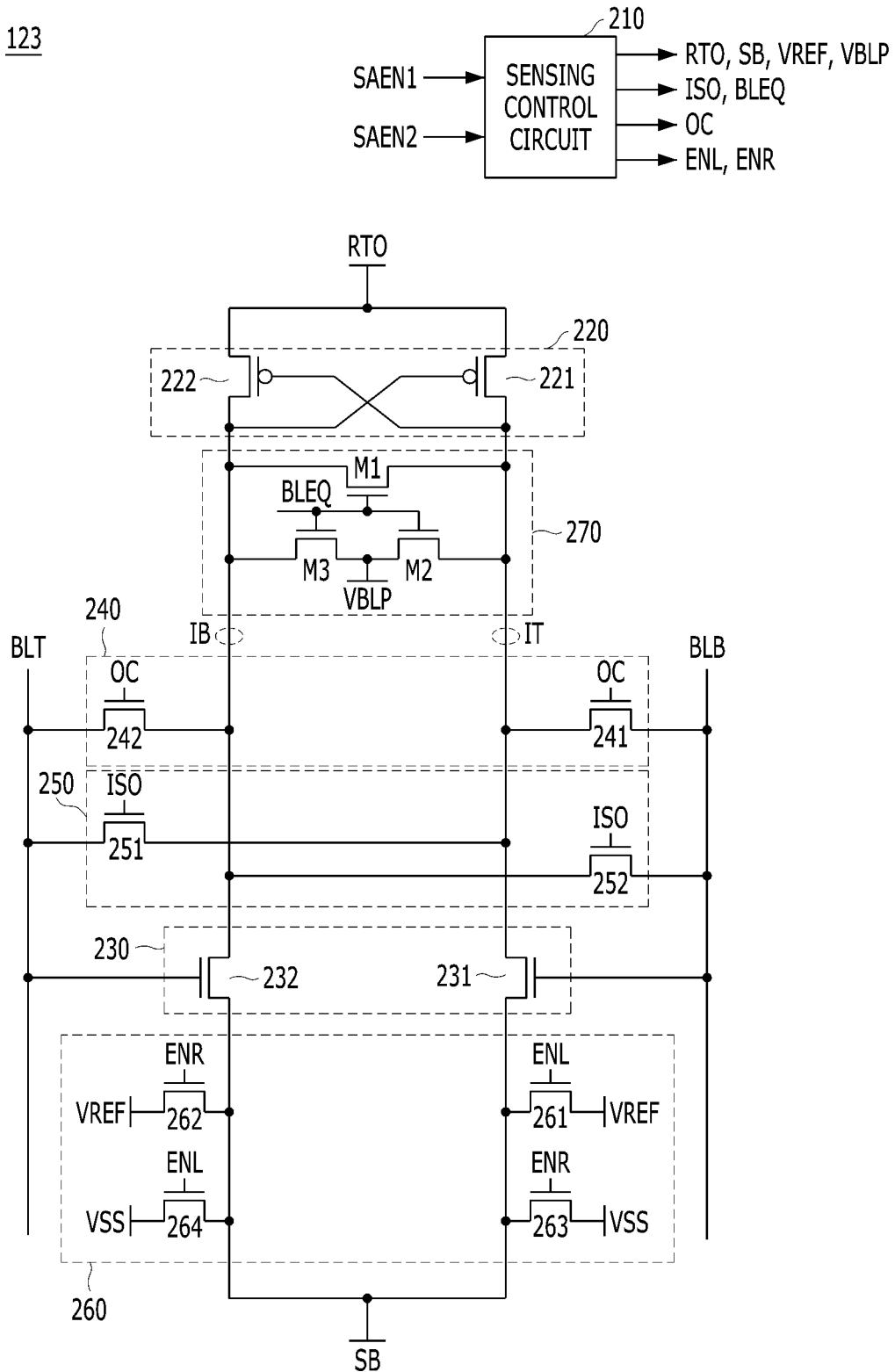
FIG. 3 is a circuit diagram illustrating a sense amplifying circuit of FIG. 1 in accordance with an embodiment of the present invention.

FIG. 3 is a circuit diagram illustrating the sense amplifying circuit 123 of FIG. 1 in accordance with an embodiment of the present invention. In FIG. 3, a configuration of a bit line sense amplifier coupled to a pair of bit lines BLT and BLB is illustrated.

Referring to FIG. 3, the bit line sense amplifier may include a sensing control circuit 210, a pull-up circuit 220, a pull-down circuit 230, an offset cancellation circuit 240, an isolation circuit 250, a bias circuit 260 and a first precharge circuit 270.

The sensing control circuit 210 may drive a pull-up power line RTO and a pull-down power line SB generate a pull-up control signal (SAP of FIG. 4), a pull-down control signal (SAN of FIG. 4) in response to the first sensing control signal SAEN1 or the second sensing control signal SAEN2. The sensing control circuit 210 may adjust a level of a bit line precharge voltage VBLP and a level of a bias voltage VREF in response to the first sensing control signal SAEN1 or the second sensing control signal SAEN2. The sensing control circuit 210 may generate an equalization signal BLEQ and an isolation signal ISO in response to the first sensing control signal SAEN1 or the second sensing control signal SAEN2. The sensing control circuit 210 may generate an offset cancellation signal OC according to the first sensing control signal SAEN1, and generate a first bias control signal ENL and a second bias control signal ENR according to the second sensing control signal SAEN2. A detailed configuration and operation of the sensing control circuit 210 will be described with reference to FIGS. 4 to 7.

The pull-up circuit 220 may include first and second PMOS transistors 221 and 222. The first and second PMOS transistors 221, 222 are respectively coupled between the pull-up power line RTO and first and second inner bit lines IT and IB, and may be arranged in a cross-coupled structure in which a gate and a drain are coupled to each other.

The pull-down circuit 230 may include first and second NMOS transistors 231 and 232. The first and second NMOS transistors 231 and 232 may be respectively coupled between the first and second inner bit lines IT and IB and the pull-down power line SB. The first NMOS transistor 231 may have a gate coupled to the negative bit line BLB, and the second NMOS transistor 232 may have a gate coupled to the positive bit line BLT. The pull-up circuit 220 and the pull-down circuit 230 having such a structure have a latch structure, and may detect and amplify data of the pair of bit lines BLT and BLB.

The offset cancellation circuit 240 may perform an offset cancellation operation to remove an offset due to a mismatch between the positive bit line BLT and the negative bit line BLB before a sensing operation of sensing and amplifying a voltage difference between the positive bit line BLT and the negative bit line BLB. The offset cancellation circuit 240 may correspond to the first operational circuit. In more detail, the offset cancellation circuit 240 may include a first offset cancellation switch 241 and a second offset cancellation switch 242. The first offset cancellation switch 241 may electrically couple the first inner bit line IT and the negative bit line BLB in response to the offset cancellation signal OC.

The second offset cancellation switch 242 may electrically couple the second inner bit line IB and the positive bit line BLT in response to the offset cancellation signal OC. Each of the first offset cancellation switch 241 and the second offset cancellation switch 242 may be implemented with an NMOS transistor.

The isolation circuit 250 may separate the first inner bit line IT from the positive bit line BLT, and the second inner bit line IB from the negative bit line BLB, except during a sensing operation or a precharge operation. That is, the isolation circuit 250 may couple the positive bit line BLT and the first inner bit line IT, and couple the second inner bit line IB and the negative bit line BLB during the sensing operation or the precharge operation. In more detail, the isolation circuit 250 may include a first isolation switch 251 and a second isolation switch 252. The first isolation switch 251 may electrically couple the positive bit line BLT and the first inner bit line IT in response to the isolation signal ISO. The second isolation switch 252 may electrically couple the negative bit line BLB and the second inner bit line IB in response to the isolation signal ISO. Each of the first isolation switch 251 and the second isolation switch 252 may be implemented with an NMOS transistor.

The bias circuit 260 may perform a recovery operation of applying the bias voltage VREF to one of the first inner bit line IT and the second inner bit line IB before a charge sharing operation. The bias circuit 260 may correspond to the second operational circuit. In more detail, the bias circuit 260 may include a first bias switch 261 and a second bias switch 262. The first bias switch 261 may couple the bias voltage VREF and the first inner bit line IT in response to the first bias control signal ENL. The second bias switch 262 may couple the bias voltage VREF and the second inner bit line IB in response to the second bias control signal ENR. According to an embodiment, the bias circuit 260 may further include a third bias switch 263 and a fourth bias switch 264. The third bias switch 263 may couple a ground voltage VSS and the first inner bit line IT in response to the second bias control signal ENR. The fourth bias switch 264 may couple the ground voltage VSS and the second inner bit line IB in response to the first bias control signal ENL.

The first precharge circuit 270 may precharge the positive bit line BLT and the negative bit line BLB with the bit line precharge voltage VBLP in response to the equalization signal BLEQ. Preferably, the bit line precharge voltage VBLP may be a half level VDD/2 of the power supply voltage VDD. For example, the first precharge circuit 270 may have a first transistor M1 coupled between the positive bit line BLT and the negative bit line BLB, a second transistor M2 coupled between the positive bit line BLT and a bit line precharge voltage (VBLP) terminal, and a third transistor M3 coupled between the VBLP terminal and the negative bit line BLB, wherein each of the first to third transistors M1 to M3 may be implemented with an NMOS transistor receiving the equalization signal BLEQ with its gate.

Meanwhile, the column control circuit 125 may include a column decoder that decodes the column address CADD to generate a column selection signal Yi. In addition, the column control circuit 125 may further include a first connection transistor coupled between the positive bit line BLT and the data lines DL, a gate for receiving the column selection signal Yi, and a second connection transistor coupled between the negative bit line BLT and the data lines DL, a gate for receiving the column selection signal Yi.

Figure 4:
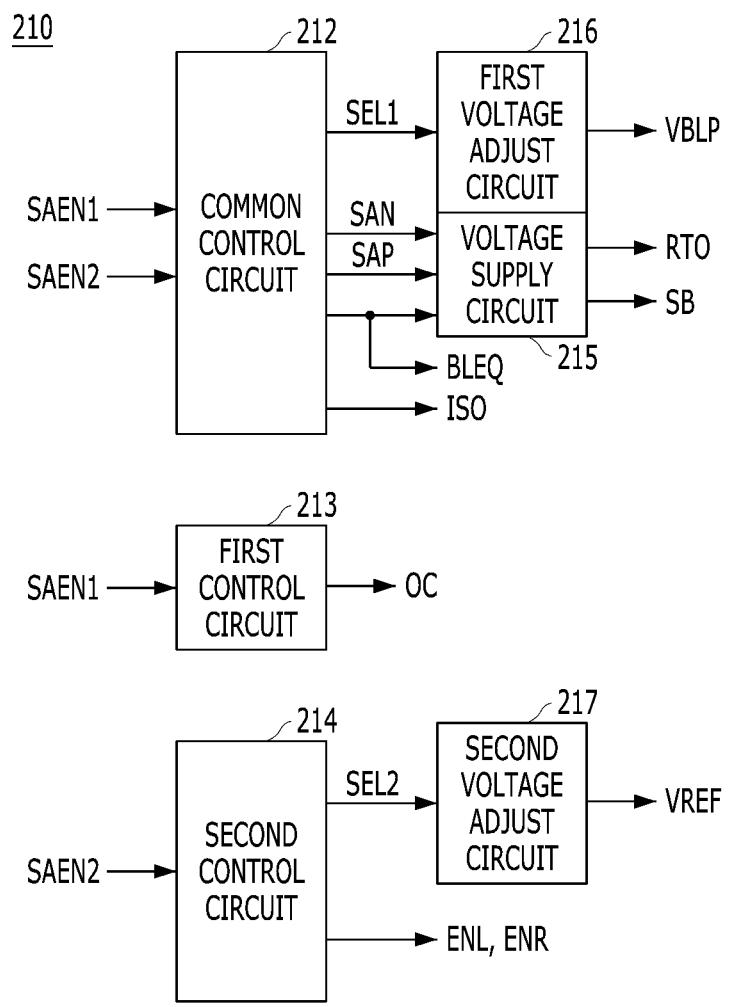
FIG. 4 is a detailed configuration diagram illustrating a sensing control circuit of FIG. 3 in accordance with an embodiment of the present invention.

FIG. 4 is a detailed configuration diagram illustrating the sensing control circuit 210 of FIG. 3 in accordance with an embodiment of the present invention.

Referring to FIG. 4, the sensing control circuit 210 may include a common control circuit 212, a first control circuit 213, a second control circuit 214, a voltage supply circuit 215, a first voltage adjust circuit 216, and a second voltage adjust circuit 217.

The common control circuit 212 may generate the pull-up control signal SAP, the pull-down control signal SAN, the equalization signal BLEQ, and the isolation signal ISO as the first sensing control signal SAEN1 or the second sensing control signal SAEN2 is activated. When the first sensing control signal SAEN1 is activated, the common control circuit 212 may generate a first selection signal SEL1. That is, the common control circuit 212 may generate the first selection signal SEL1 only during the first operation, i.e., the DRAM operation.

The voltage supply circuit 215 may supply the power supply voltage VDD to the pull-up power line RTO in response to the pull-up control signal SAP, and may supply the ground voltage VSS to the pull-down power line SB in response to the pull-down control signal SAN. In addition, the voltage supply circuit 215 may precharge the pull-up power line RTO and the pull-down power line SB to the bit line precharge voltage VBLP in response to the equalization signal BLEQ. A detailed configuration of the voltage supply circuit 215 will be described with reference to FIG. 5.

The first voltage adjust circuit 216 provides the bit line precharge voltage VBLP with a half level between the power supply voltage VDD and the ground voltage VSS, while adjusting the level of the bit line precharge voltage VBLP according to the first selection signal SEL1. For example, the first voltage adjust circuit 216 may provide the bit line precharge voltage VBLP having the half level between the power supply voltage VDD and the ground voltage VSS when the first selection signal SEL1 is deactivated. The first voltage adjust circuit 216 may lower the level of the bit line precharge voltage VBLP whenever the first selection signal SEL1 is activated. That is, the first voltage adjust circuit 216 may provide the bit line precharge voltage VBLP having the half level during the second operation, and may adjust the level of the bit line precharge voltage VBLP to be decreased according to the first selection signal SEL1 during the first operation. A detailed configuration of the first voltage adjust circuit 216 will be described with reference to FIG. 6.

The first control circuit 213 may generate the offset cancellation signal OC as the first sensing control signal SAEN1 is activated.

The second control circuit 214 may generate a second selection signal SEL2, the first bias control signal ENL and the second bias control signal ENR as the second sensing control signal SAEN2 is activated. That is, the second control circuit 214 may generate the second selection signal SEL2 only during the second operation, i.e., the FeRAM operation. Depending on an embodiment, the second control circuit 214 may adjust a slew rate of at least one of the first bias control signal ENL and the second bias control signal ENR as the second sensing control signal SAEN2 is activated.

The second voltage adjust circuit 217 provides the bias voltage VREF with a voltage level between the bit line precharge voltage VBLP and the ground voltage VSS, while adjusting the level of the bias voltage VREF according to the second selection signal SEL2. For example, the second voltage adjust circuit 217 may provide the bias voltage VREF having an intermediate level between the bit line precharge voltage VBLP and the ground voltage VSS when the second selection signal SEL2 is deactivated. The second voltage adjust circuit 217 may lower the level of the bias voltage VREF whenever the second selection signal SEL2 is activated. That is, the second voltage adjust circuit 217 may adjust the level of the bias voltage VREF to be decreased according to the second selection signal SEL2 during the second operation. A detailed configuration of the second voltage adjust circuit 217 will be described with reference to FIG. 7.

Figure 5:
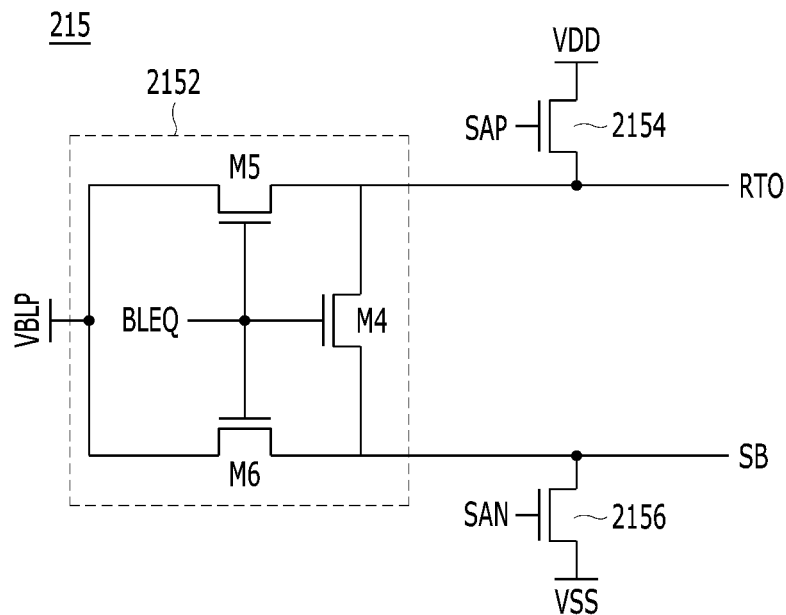
FIG. 5 is a circuit diagram illustrating a voltage supply circuit of FIG. 4 in accordance with an embodiment of the present invention.

FIG. 5 is a circuit diagram illustrating the voltage supply circuit 215 of FIG. 4 in accordance with an embodiment of the present invention.

Referring to FIG. 5, the voltage supply circuit 215 may include a second precharge circuit 2152, a pull-up switch 2154, and a pull-down switch 2156.

The second precharge circuit 2152 may precharge the pull-up power line RTO and the pull-down power line SB to the bit line precharge voltage VBLP in response to the equalization signal BLEQ. For example, the second precharge circuit 2152 may include a fourth transistor M4 coupled between the pull-up power line RTO and the pull-down power line SB, a fifth transistor M5 coupled between the pull-up power line RTO and a bit line precharge voltage (VBLP) terminal, and a sixth transistor M6 coupled between the VBLP terminal and the pull-down power line SB, wherein each of the fourth to sixth transistors M4 to M6 may be implemented with an NMOS transistor receiving the equalization signal BLEQ with its gate.

The pull-up switch 2154 may be implemented with a transistor coupled between a power supply voltage (VDD) terminal and the pull-up power line RTO, and having a gate receiving the pull-up control signal SAP. The pull-down switch 2156 may be implemented with a transistor coupled between a ground voltage (VSS) terminal and the pull-down power line SB, and having a gate receiving the pull-down control signal SAN. Each of the pull-up switch 2154 and the pull-down switch 2156 may be implemented with an NMOS transistor.

With the above configuration, the voltage supply circuit 215 may drive the pull-up power line RTO and the pull-down power line SB in response to the first sensing control signal SAEN1 or the second sensing control signal SAEN2.

Figure 6:
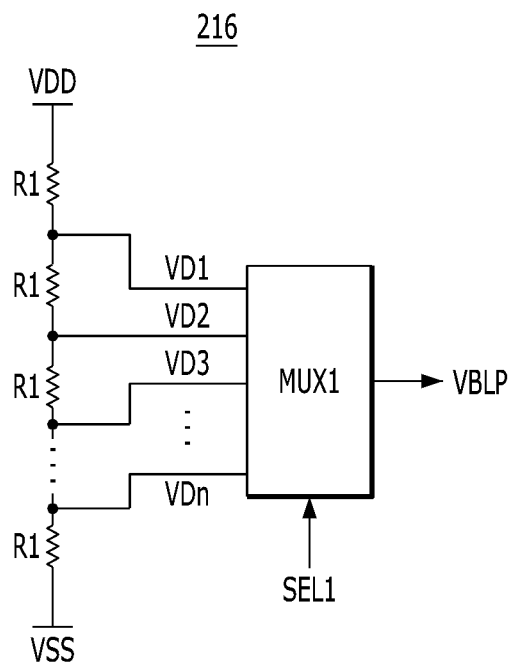
FIG. 6 is a circuit diagram illustrating a first voltage adjust circuit of FIG. 4 in accordance with an embodiment of the present invention.

FIG. 6 is a circuit diagram illustrating the first voltage adjust circuit 216 of FIG. 4 in accordance with an embodiment of the present invention.

Referring to FIG. 6, the first voltage adjust circuit 216 may include a plurality of first resistors R1 and a first selector MUX1.

The first resistors R1 may be coupled in series between a power supply voltage (VDD) terminal and a ground voltage (VSS) terminal. A plurality of distribution voltages VD1 to VDn may be output between the first resistors R1. The first selector MUX1 may output the bit line precharge voltage VBLP by selecting a distribution voltage having a half level between the power supply voltage VDD and the ground voltage VSS among the distribution voltages VD1 to VDn, while selecting a distribution voltage having a level lower than the selected distribution voltage whenever the first selection signal SEL1 is activated.

With the above configuration, the first voltage adjust circuit 216 may provide the bit line precharge voltage VBLP with the half level between the power supply voltage VDD and the ground voltage VSS, but may lower the level of the bit line precharge voltage VBLP whenever the first selection signal SEL1 is activated.

Figure 7:
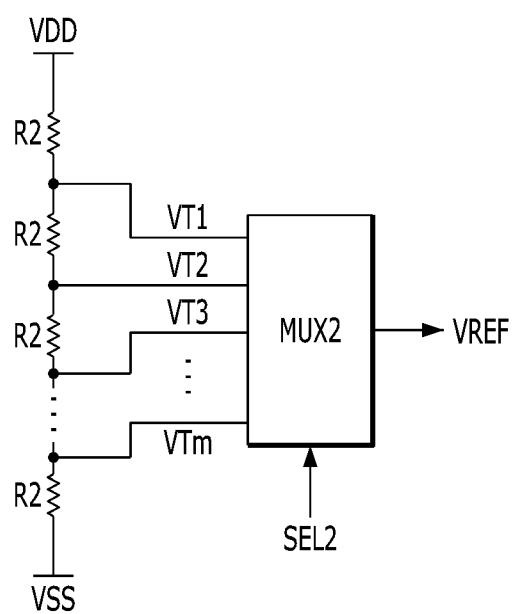
FIG. 7 is a circuit diagram illustrating a second voltage adjust circuit of FIG. 4 in accordance with an embodiment of the present invention.

FIG. 7 is a circuit diagram illustrating the second voltage adjust circuit 217 of FIG. 4 in accordance with an embodiment of the present invention.

Referring to FIG. 7, the second voltage adjust circuit 217 may include a plurality of second resistors R2 and a second selector MUX2.

The second resistors R2 may be coupled in series between a power supply voltage (VDD) terminal and a ground voltage (VSS) terminal. A plurality of distribution voltages VT1 to VTm may be output between the second resistors R2. The second selector MUX2 may output the bias voltage VBLP by selecting a distribution voltage having a half level between the power supply voltage VDD and the ground voltage VSS among the distribution voltages VT1 to VTm, while selecting a distribution voltage having a level lower than the selected distribution voltage whenever the second selection signal SEL2 is activated.

With the above configuration, the second voltage adjust circuit 217 may provide the bias voltage VREF with an intermediate level between the bit line precharge voltage VBLP and the ground voltage VSS, but may lower the level of the bias voltage VREF whenever the second selection signal SEL2 is activated.

Hereinafter, an offset cancellation operation for DRAM will be described as an example of the first operation of the memory device 100 according to an embodiment of the present invention with reference to the drawings.

Figure 8:
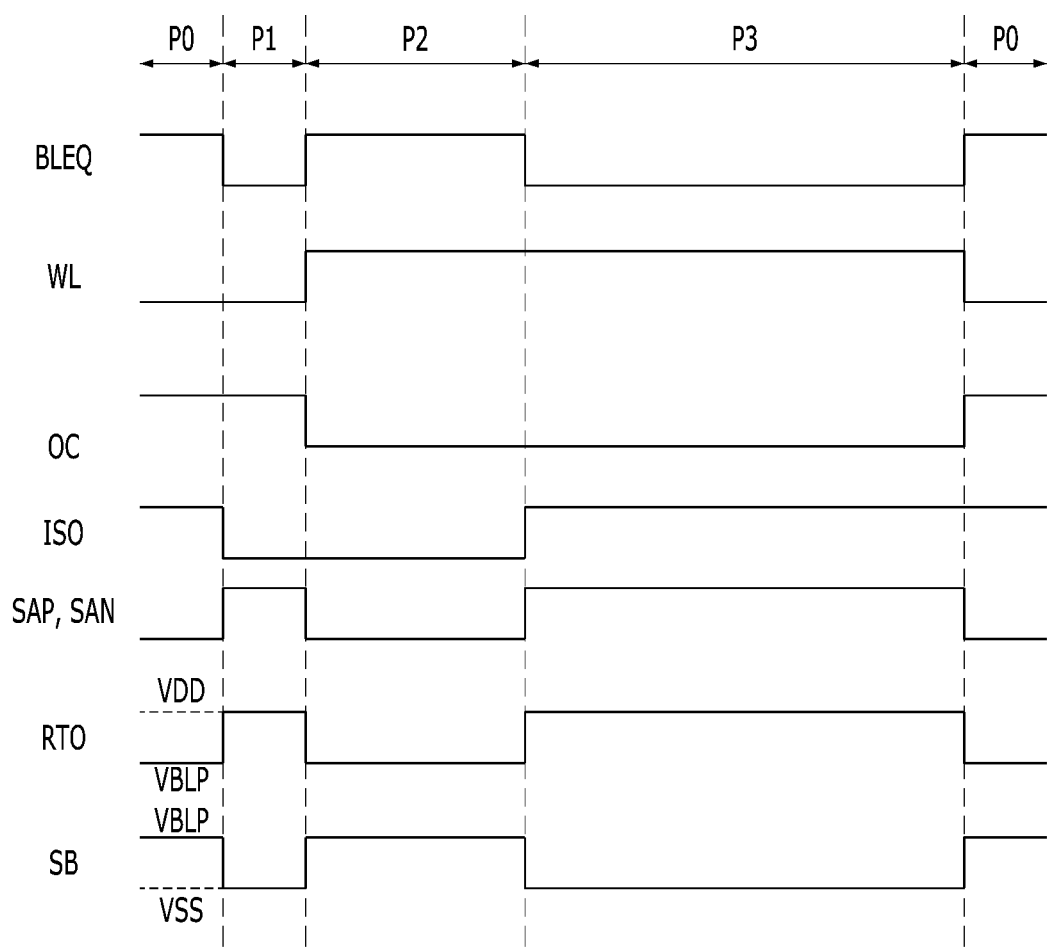
FIGS. 8 to 9D are diagrams for describing a DRAM operation of a memory device in accordance with an embodiment of the present invention.

FIG. 8 is a timing diagram for describing a DRAM operation of the sense amplifying circuit 123 in accordance with an embodiment of the present invention. FIGS. 9A to 9D are circuit diagrams showing a connection state of the sense amplifying circuit 123 during each of a precharge operation P0, an offset cancellation operation P1, a charge sharing operation P2 and a sensing operation P3 in accordance with an embodiment of the present invention.

Referring to FIG. 8, the sense amplifying circuit 123 may sequentially perform the precharge operation P0, the offset removal operation P1, the charge sharing operation P2, and the sensing operation P3.

Figure 9A:
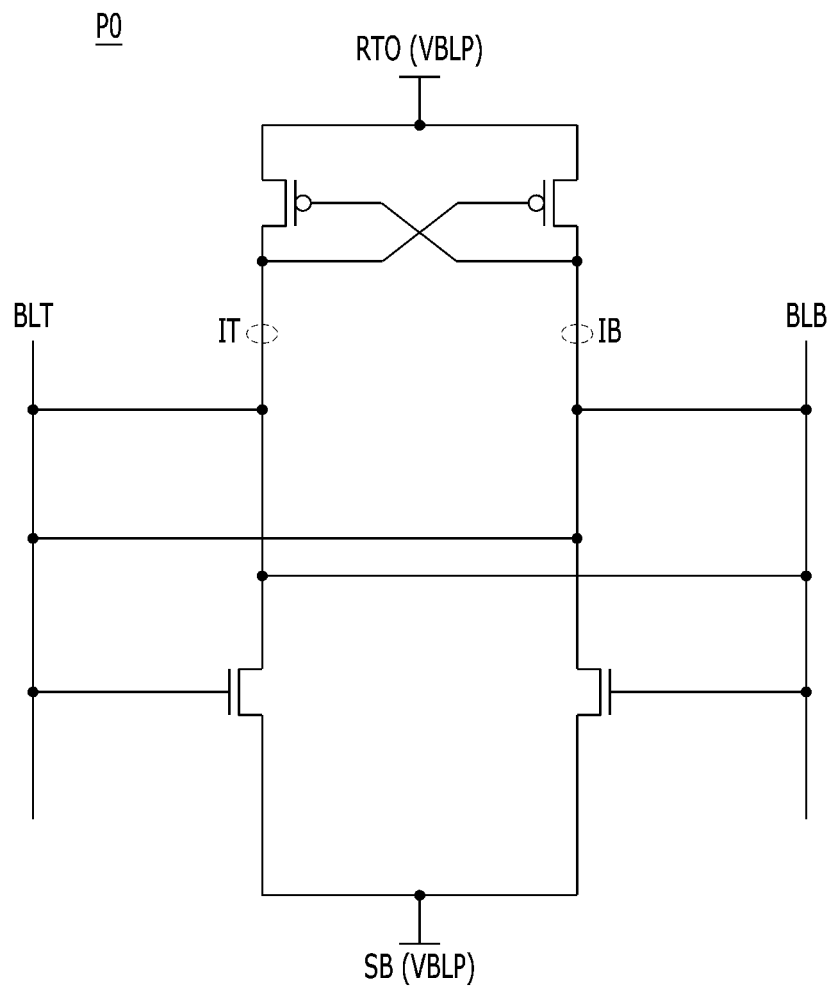

Referring to FIGS. 8 and 9A, during the precharge operation P0, the equalization signal BLEQ, the offset cancellation signal OC, and the isolation signal ISO are activated at a logic high level, and the pull-up control signal SAP and the pull-down control signal SAN are deactivated at a logic low level. In response to the equalization signal BLEQ, the first to sixth NMOS transistors M1 to M6 of the first precharge circuit 270 and the second precharge circuit 2152 are turned on, and the bit line precharge voltage VBLP is applied to the pull-up power line RTO and pull-down power line SB, and the positive bit line BLT and the negative bit line BLB. In addition, in response to the isolation signal ISO, the first isolation switch 251 and the second isolation switch 252 may be turned on. In response to the offset cancellation signal OC, the first offset cancellation switch 241 and the second offset cancellation switch 242 may be turned on. As a result, during the precharge operation P0, the bit line precharge voltage VBLP may be applied to the first inner bit line IT, the second inner bit line IB, the positive bit line BLT, and the negative bit line BLB, and all of them may be precharged at the same voltage level (i.e., the bit line precharge voltage VBLP).

Figure 9B:
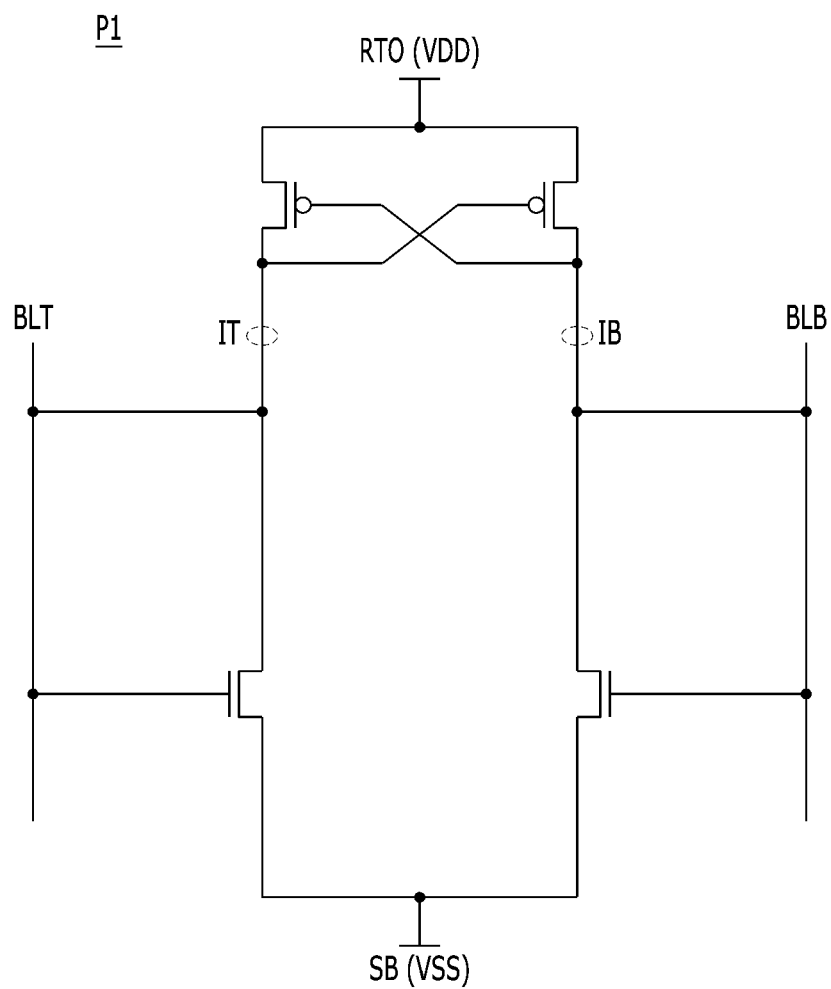

Referring to FIGS. 8 and 9B, during the offset cancellation operation P1, the offset cancellation signal OC maintains an active state at a logic high level, the equalization signal BLEQ and the isolation signal ISO are deactivated at a logic low level, and the pull-up control signal SAP and the pull-down control signal SAN are activated at a logic high level. In response to the pull-up control signal SAP and the pull-down control signal SAN, a pull-up voltage of the power supply voltage (VDD) level is applied to the pull-up power line RTO and a pull-down voltage of the ground voltage (VSS) level is applied to the pull-down power line SB. In response to the offset cancellation signal OC, the first offset cancellation switch 241 and the second offset cancellation switch 242 are turned on to connect the positive bit line BLT and the second inner bit line IB, and connect the negative bit line BLB and the first inner bit line IT. As a result, as shown in FIG. 9B, both the first and second NMOS transistors 231 and 232 of the pull-down circuit 230 are in a diode-connected state.

At this time, when a threshold voltage of the first NMOS transistor 231 and a threshold voltage of the second NMOS transistor 232 are different from each other due to the process, voltage and temperature (PVT), the positive bit line BLT or the negative bit line BLB increases or decreases by an offset voltage than the bit line precharge voltage VBLP. Accordingly, the positive bit line BLT and the negative bit line BLB have a difference by the offset voltage, and this offset voltage may be stored in a parasitic capacitor connected to the positive bit line BLT or a parasitic capacitor connected to the negative bit line BLB.

Figure 9C:
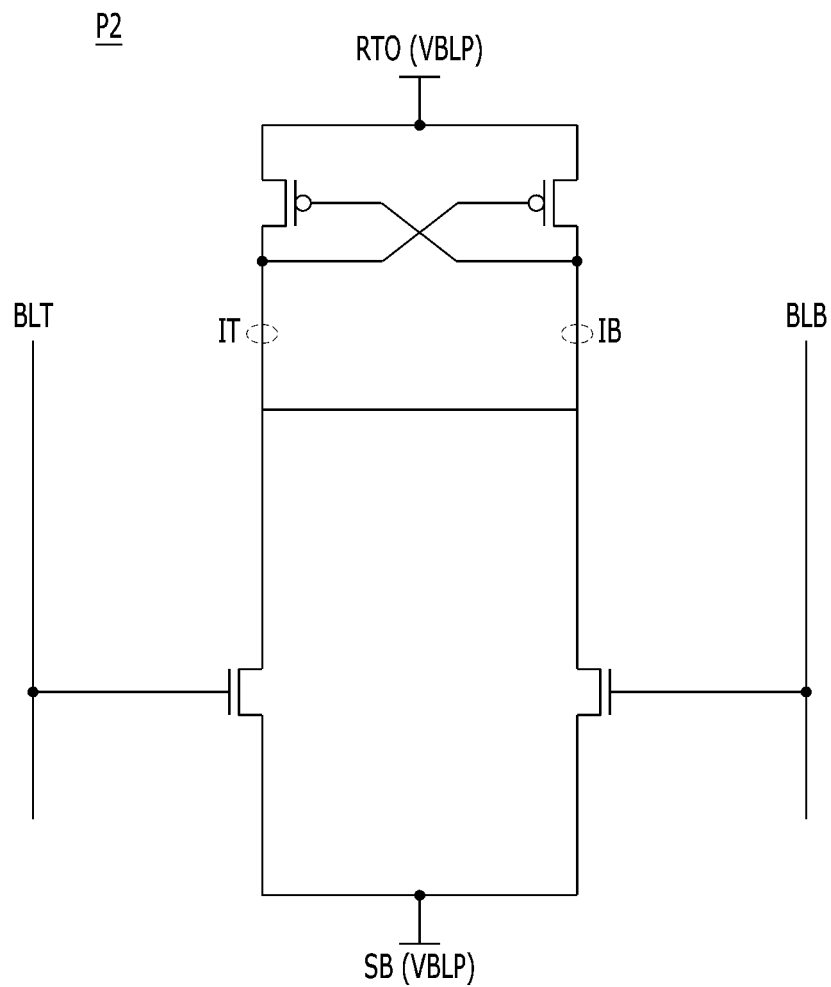

Referring to FIGS. 8 and 9C, during the charge sharing operation P2, the offset cancellation signal OC, the isolation signal ISO, the pull-up control signal SAP, and the pull-down control signal SAN are deactivated at a logic low level, and the equalization signal BLEQ and the word line WL are activated. Accordingly, the access transistor of the memory cell MC connected to the word line WL may be turned on to perform a charge sharing operation in which the charge stored in the cell capacitor flows into the positive bit line BLT. The level (VBLP+ΔV) of the positive bit line BLT may be slightly higher or lower than the level of the negative bit line BLB by the charge sharing operation. At this time, according to the equalization signal BLEQ, the first inner bit line IT and the second inner bit line IB may be precharged to the bit line precharge voltage VBLP.

Figure 9D:
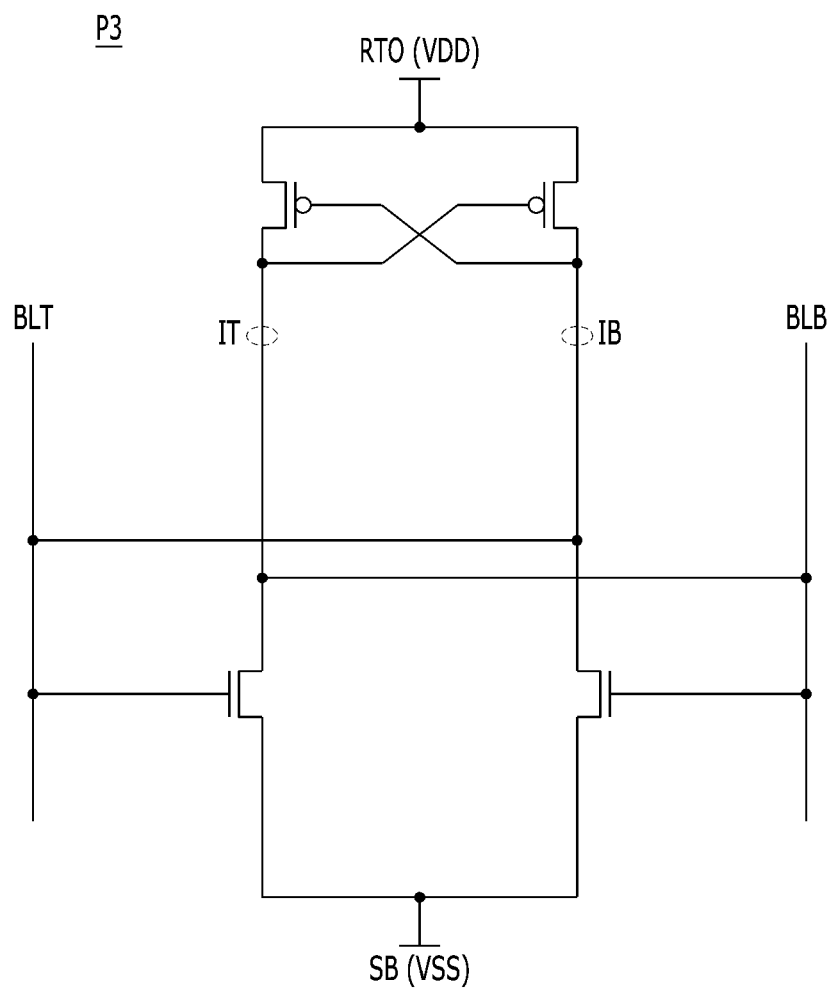

Referring to FIGS. 8 and 9D, during the sensing operation P3, the equalization signal BLEQ and the offset cancellation signal OC are deactivated, and the isolation signal ISO, the pull-up control signal SAP, and the pull-down control signal SAN are activated. Accordingly, the voltage difference between the positive bit line BLT and the negative bit line BLB may be sensed and amplified by a first inverter including the first PMOS transistor 221 and the first NMOS transistor 231, and a second inverter including the second PMOS transistor 222 and the second NMOS transistor 232. Since the sensing operation is started while the offset voltage is stored in the parasitic capacitor, the sense amplifying circuit 123 may perform the sensing operation very accurately.

Hereinafter, a recovery operation for FeRAM will be described as an example of the second operation of the memory device 100 according to an embodiment of the present invention with reference to the drawings.

Figure 10:
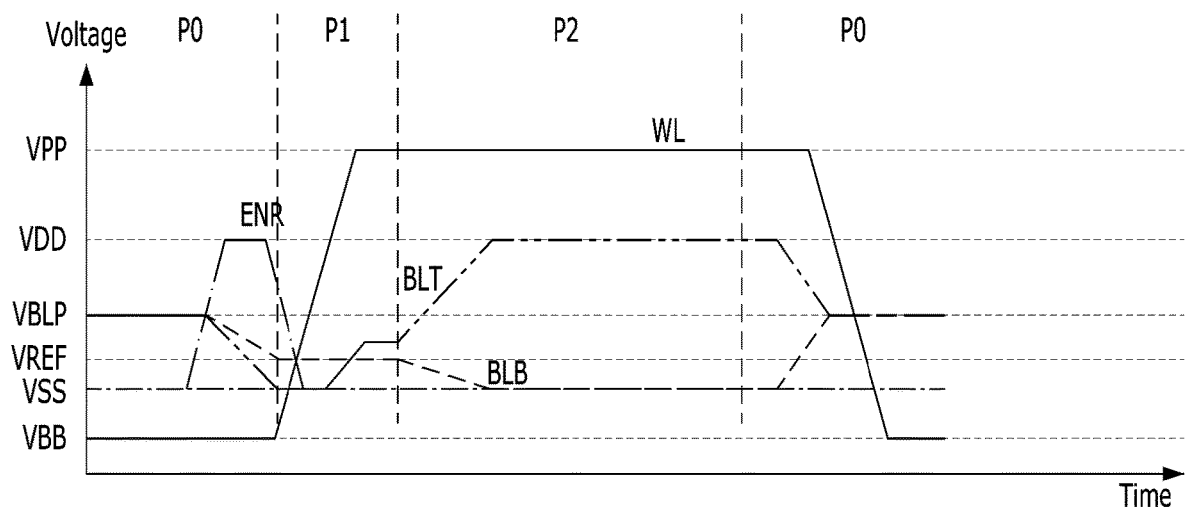
FIGS. 10 to 11 are diagrams for describing a FeRAM operation of a memory device in accordance with an embodiment of the present invention.
Figure 11:
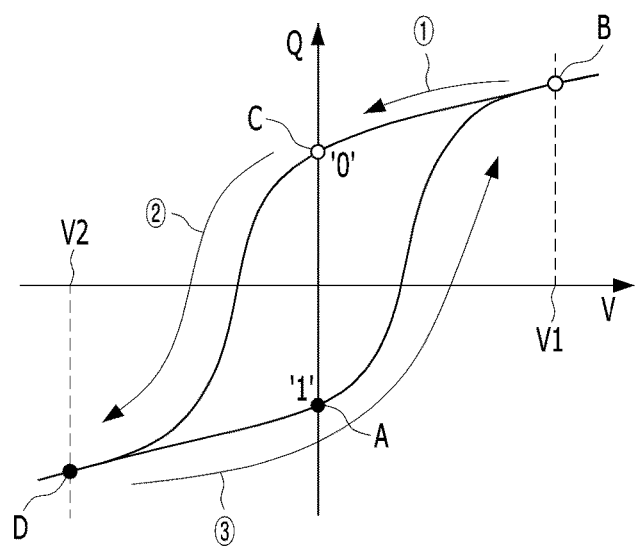

FIG. 10 is a timing diagram for describing a FeRAM operation of the sense amplifying circuit 123 in accordance with an embodiment of the present invention. FIG. 11 is a graph showing hysteresis loop characteristics of a ferroelectric material of a cell capacitor during a precharge operation P0, a charge sharing operation P1 and a sensing operation P2 of FIG. 10 in accordance with an embodiment of the present invention.

For reference, FIG. 11 illustrates an amount of charge Q stored in a cell capacitor according to a voltage V. When the cell capacitor has a ferroelectric property, the charge amount Q is proportional to the polarization of the ferroelectric material, and the polarization induced by the electric field is not extinguished but maintained (at an A or C state) due to residual polarization or spontaneous polarization even if the electric field is removed. Hereinafter, a case where the A state corresponds to a logic high level and the C state corresponds to a logic low level will be described as an example.

Referring to FIG. 10, the sense amplifying circuit 123 may sequentially perform the precharge operation P0, the charge sharing operation P1, and the sensing operation P2.

Referring to FIG. 10, during the precharge operation P0, the bit line equalization signal BLEQ is activated at a logic high level, and thus the positive bit line BLT and the negative bit line BLB are precharged with the bit line precharge voltage VBLP. Accordingly, as shown in FIG. 11, as a (+) voltage V1 is removed, a B state reaches the C state corresponding to a logic low level (see an arrow ①).

Before the word line WL is activated, when the second bias control signal ENR is activated, the second bias switch 262 may be activated to apply the bias voltage VREF to the second inner bit line IB. In this case, as the second isolation switch 252 is turned on to electrically connect the negative bit line BLB and the second inner bit line IB, a recovery operation in which the bias voltage VREF is applied to the negative bit line BLB may be performed. In this case, the reference voltage VREF may have an intermediate level between the bit line precharge voltage VBLP and the ground voltage VSS. In addition, the third bias switch 263 may also be turned on to apply the ground voltage VSS to the first inner bit line IT. In this case, as the first isolation switch 251 is turned on to electrically connect the positive bit line BLT and the first inner bit line IT, the ground voltage VSS may be applied to the positive bit line BLT. Accordingly, as shown in FIG. 11, the voltage at both ends of the cell capacitor of the memory cell moves from the power supply voltage (VDD) level to the ground voltage (VSS) level, and an electric charge is generated, thereby reaching a D state from the C state (see an arrow ②).

During the charge sharing operation P1, the word line WL is activated. The potential of the positive bit line BLT increases due to the charge generated during the recovery operation, and the potential of the positive bit line BLT is greater than that of the negative bit line BLB. For reference, during the recovery operation, the reference voltage VREF and the ground voltage VSS may be complementarily supplied to the positive bit line BLT and the negative bit line BLB to determine whether an amount of charge in the cell capacitor of the memory cell connected to the positive bit line BLT is sufficient to occur ferroelectric switching.

During the sensing operation P2, as the power supply voltage VDD and the ground voltage VSS are applied to the pull-up power line RTO and the pull-down power line SB, the bit line sense amplifier 123 may sense and amplify a voltage difference between the positive bit line BLT and the negative bit line BLB. As a result, the positive bit line BLT reaches the power supply voltage (VDD) level, and the negative bit line BLB becomes the ground voltage (VSS) level, so that a logic high level of data may be written to the memory cell. As shown in FIG. 11, during the sensing operation P2, a (−) voltage V2 is removed, and the D state reaches the A state corresponding to a logic high level (see an arrow ③).

Figure 12:
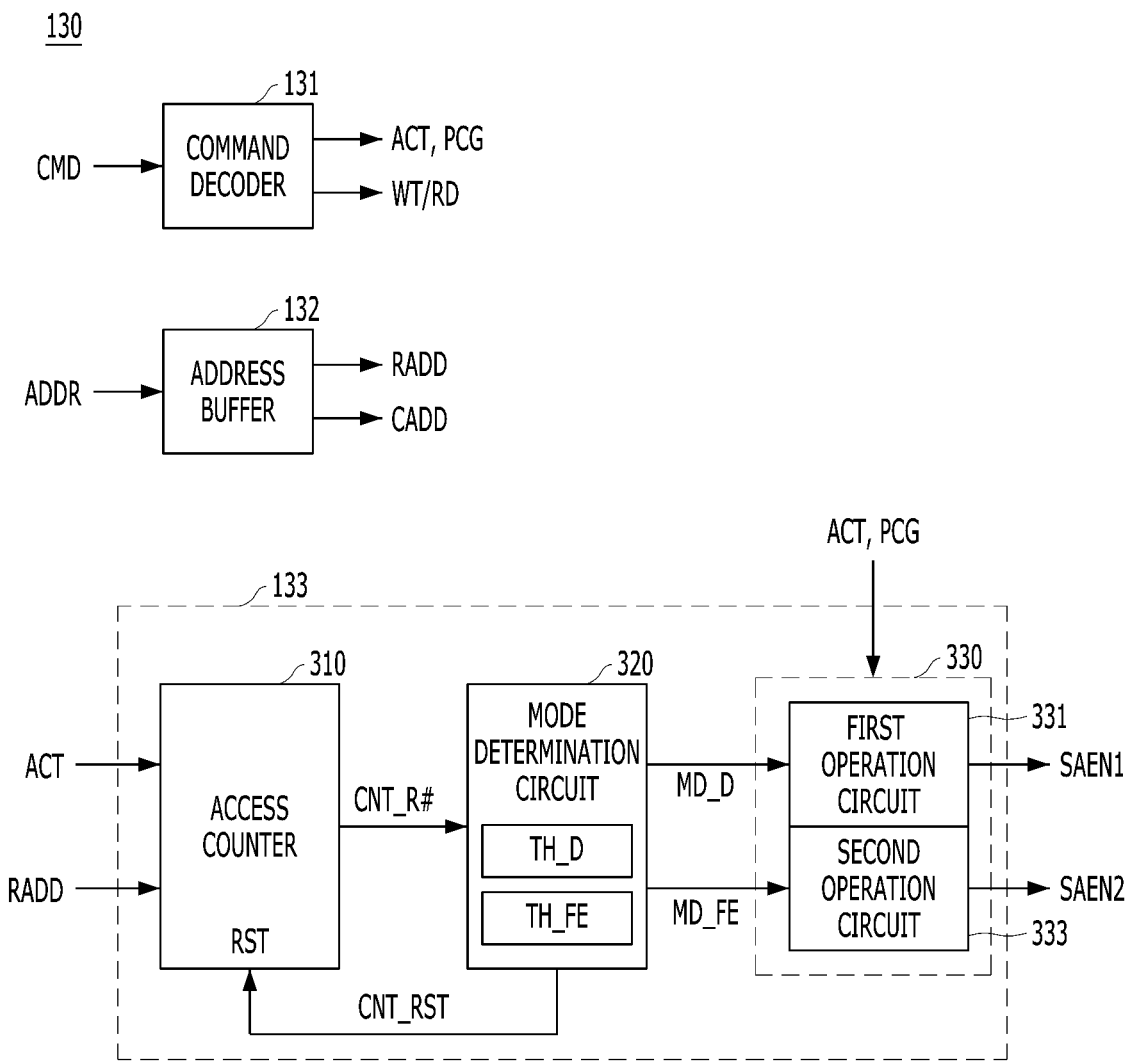
FIG. 12 is a detailed configuration diagram illustrating a control logic of FIG. 1 in accordance with a first embodiment of the present invention.

FIG. 12 is a detailed configuration diagram illustrating the control logic 130 of FIG. 1 in accordance with a first embodiment of the present invention.

Referring to FIG. 12, the control logic 130 may include a command decoder 131, an address buffer 132, and an operational monitoring circuit 133.

The command decoder 131 may decode the command CMD from an external device (e.g., a memory controller) to generate the active command ACT, the precharge command PCG, the read command RD, the write command WT, and the like.

The address buffer 132 may receive the address ADD from the external device and buffer the received address ADD to generate the row address RADD and the column address CADD. Each of the command CMD and the address ADD may include multi-bit signals.

The operational monitoring circuit 133 may generate the first sensing control signal SAEN1 and the second sensing control signal SAEN2, which are activated in response to the active command ACT and deactivated in response to the precharge command PCG. The operational monitoring circuit 133 may provide the first sensing control signal SAEN1 and the second sensing control signal SAEN2 by monitoring whether at least some of the memory cells MC have a ferroelectric property or an anti-ferroelectric property. In particular, the operational monitoring circuit 133 according to the first embodiment of the present invention may generate access counting values CNT_R #by counting the number of accesses to the memory cells MC based on the active command ACT and the row address RADD, and may provide the first sensing control signal SAEN1 or the second sensing control signal SAEN2 based on the access counting values CNT_R #.

In detail, the operational monitoring circuit 133 may include an access counter 310, a mode determination circuit 320, and an operation control circuit 330.

The access counter 310 may generate the access counting values CNT_R #(#corresponding to the number of word lines) by counting the number of accesses to memory cells MC based on the active command ACT and the row address RADD. The access counter 310 may include a plurality of unit counters that correspond to each of the word lines WL and output a corresponding access counting value. When the active command ACT is input, the access counter 310 may increase a counting value of a unit counter corresponding to a word line designated by the row address RADD. Accordingly, the access counter 310 may count the number of accesses for each word line. The access counter 310 may initialize the unit counters according to a counting reset signal CNT_RST.

The mode determination circuit 320 may activate a second mode signal MD_FE by comparing the access counting values CNT_R #and a first threshold value TH_D, and may activate a first mode signal MD_D by comparing the access counting values CNT_R #and a second threshold value TH_FE. When a predetermined number of ones among the access counting values CNT_R #individually exceed the first threshold value TH_D in a state that the first mode signal MD_D is activated, the mode determination circuit 320 may deactivate the first mode signal MD_D and activate the second mode signal MD_FE. That is, when the number of access counting values CNT_R #, each of which exceeds the first threshold value TH_D, reaches the predetermined number, in a state that the first mode signal MD_D is activated, the mode determination circuit 320 may deactivate the first mode signal MD_D and activate the second mode signal MD_FE. When a predetermined number of ones among the access counting values CNT_R #individually exceed the second threshold value TH_FE in a state that the second mode signal MD_FE is activated, the mode determination circuit 320 may deactivate the second mode signal MD_FE and activate the first mode signal MD_D. That is, when the number of access counting values CNT_R #, each of which exceeds the second threshold value TH_FE, reaches the predetermined number, in a state that the second mode signal MD_FE is activated, the mode determination circuit 320 may deactivate the second mode signal MD_FE and activate the first mode signal MD_D.

The mode determination circuit 320 may activate the counting reset signal CNT_RST whenever the first mode signal MD_D or the second mode signal MD_FE is activated. For reference, the first threshold value TH_D may fall in a range of accesses to a DRAM cell, within which the DRAM cell is able to normally operate, and the second threshold value TH_FE may fall in a range of accesses to a FeRAM cell, within which the FeRAM cell is able to normally operate.

The operation control circuit 330 may generate the first sensing control signal SAEN1 and the second sensing control signal SAEN2, which are activated in response to the active command ACT and deactivated in response to the precharge command PCG, and provide the first sensing control signal SAEN1 according to the first mode signal MD_D while providing the second sensing control signal SAEN2 according to the second mode signal MD_FE2.

In detail, the operation control circuit 330 may include a first operation circuit 331 and a second operation circuit 333. When the first mode signal MD_D is activated, the first operation circuit 331 may output the first sensing control signal SAEN1 that is activated in response to the active command ACT and deactivated in response to the precharge command PCG. When the second mode signal MD_FE is activated, the second operation circuit 333 may output the second sensing control signal SAEN2 that is activated in response to the active command ACT and deactivated in response to the precharge command PCG.

Figure 13:
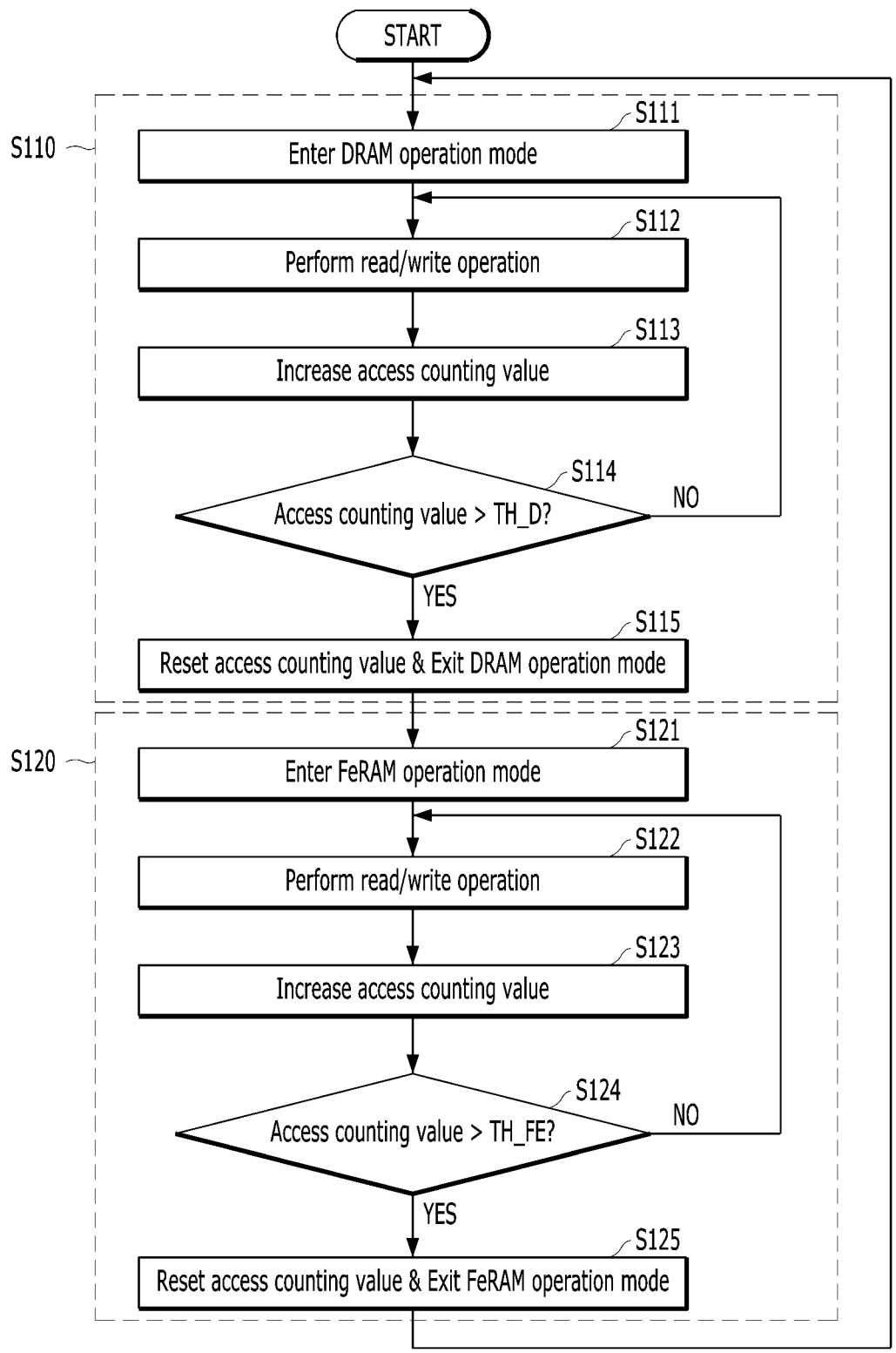
FIG. 13 is a flow chart for describing an operation of a memory device including the control logic of FIG. 12, in accordance with an embodiment of the present invention.

FIG. 13 is a flow chart for describing an operation of the memory device 100 including the control logic 130 of FIG. 12, in accordance with an embodiment of the present invention.

Referring to FIG. 13, the memory device 100 may repeatedly perform a DRAM operation S110 and a FeRAM operation S120 by monitoring whether memory cells MC have a ferroelectric property.

First, the memory device 100 may enter a mode for a DRAM operation mode (hereinafter, referred to as a DRAM operation mode) (at operation S111). In this case, the first mode signal MD_D may be activated.

The control logic 130 may decode the command CMD to generate the active command ACT, the precharge command PCG, the read command RD, the write command WT and the like, and buffer the address ADD to generate the row address RADD and the column address CADD. The peripheral circuit 120 may perform an access operation such as a read/write operation to memory cells designated by the row address RADD and the column address CADD according to the active command ACT, the precharge command PCG, and the read command RD, and the write command WT (at operation S112). At this time, the operation control circuit 330 may provide the first sensing control signal SAEN1 activated in response to the active command ACT and deactivated in response to the precharge command PCG.

The access counter 310 may increase an access counting value of a word line designated by the row address RADD whenever the active command ACT is input (at operation S113). Accordingly, the access counter 310 may count the number of accesses for each word line to update the access counting values CNT_R #.

The mode determination circuit 320 may compare the access counting values CNT_R #with the first threshold value TH_D (at operation S114). If the number of access counting values CNT_R #exceeding the first threshold TH_D is less than or equal to a predetermined number ("NO" of operation S114), the mode determination circuit 320 may perform the operations S112 to S114 repeatedly while maintaining the active state of the first mode signal MD_D.

On the other hand, if the predetermined number of ones among the access counting values CNT_R #individually exceed the first threshold value TH_D ("YES" of operation S114), the mode determination circuit 320 may deactivate the first mode signal MD_D and activate the second mode signal MD_FE. The mode determination circuit 320 may activate the counting reset signal CNT_RST as the second mode signal MD_FE is activated, and the access counter 310 may be initialized. Accordingly, the memory device 100 may exit the DRAM operation mode (at operation S115).

As the second mode signal MD_FE is activated, the memory device 100 may enter a mode for a FeRAM operation mode (hereinafter, referred to as a FeRAM operation mode) (at operation S121).

Likewise, the peripheral circuit 120 may perform an access operation such as a read/write operation on memory cells designated by the row address RADD and the column address CADD according to the active command ACT, the precharge command PCG, and the read command RD, and the write command WT (at operation S122). At this time, the operation control circuit 330 may provide the second sensing control signal SAEN2 that is activated in response to the active command ACT and deactivated in response to the precharge command PCG.

The access counter 310 may increase an access counting value of a word line designated by the row address RADD whenever the active command ACT is input (at operation S123). The mode determination circuit 320 may compare the access counting values CNT_R #with the second threshold value TH_FE (at operation S124). If the number of access counting values CNT_R #exceeding the second threshold value TH_FE is less than or equal to a predetermined number ("NO" of operation S124), the mode determination circuit 320 may perform the operations S122 to S124 repeatedly while maintaining the active state of the second mode signal MD_FE.

On the other hand, if the predetermined number of ones among the access counting values CNT_R #individually exceed the second threshold value TH_FE ("YES" of operation S124), the mode determination circuit 320 may deactivate the second mode signal MD_FE and activate the first mode signal MD_D. The mode determination circuit 320 may activate the counting reset signal CNT_RST as the second mode signal MD_FE is activated, and the access counter 310 may be initialized. Accordingly, the memory device 100 may exit the FeRAM operation mode (at operation S125).

As described above, the memory device 100 may repeatedly perform the DRAM operation S110 and the FeRAM operation S120 whenever the number of accesses to the memory cell reaches a predetermined number.

Figure 14:
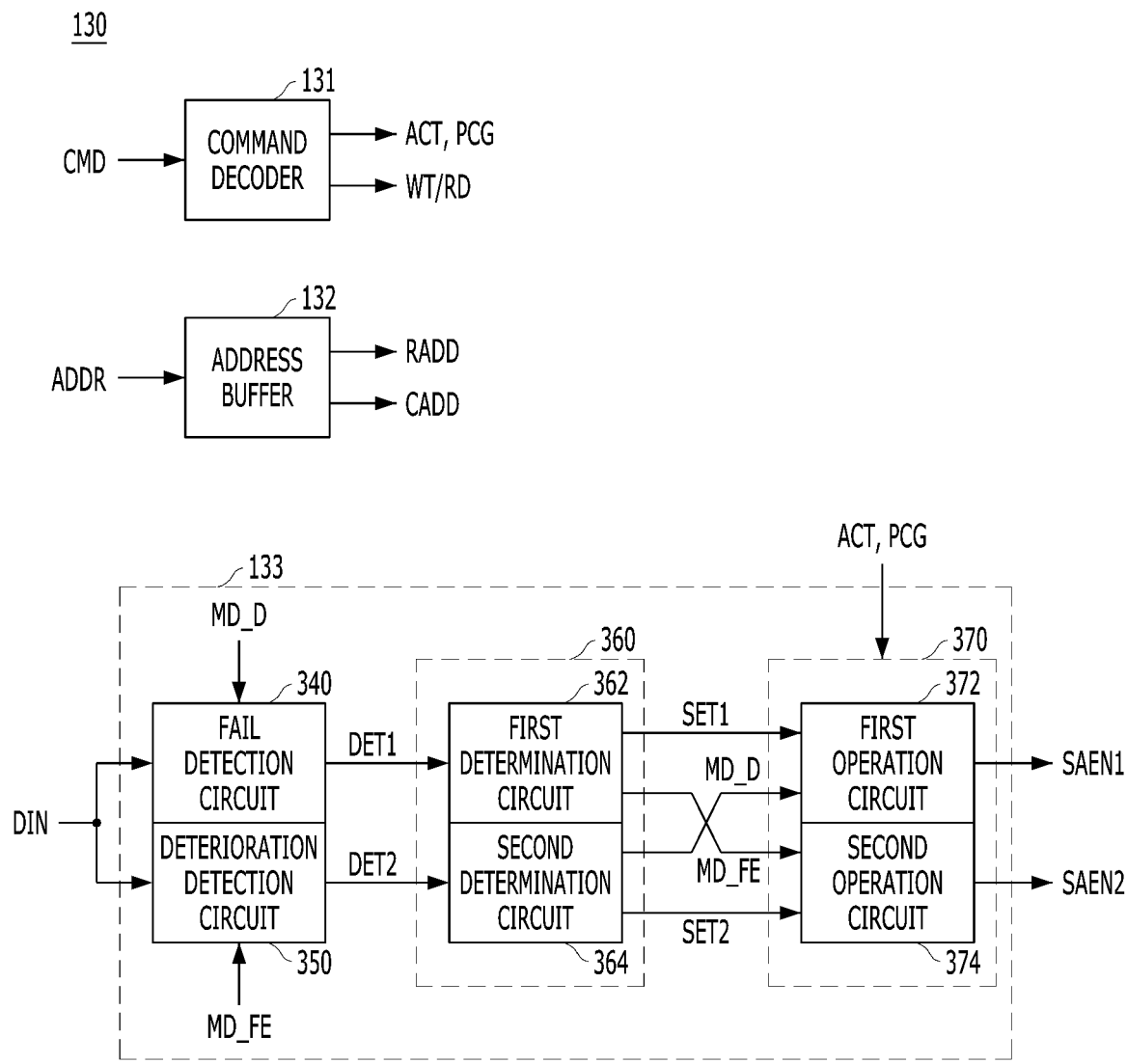
FIG. 14 is a detailed configuration diagram illustrating a control logic of FIG. 1 in accordance with a second embodiment of the present invention.
Figure 15:
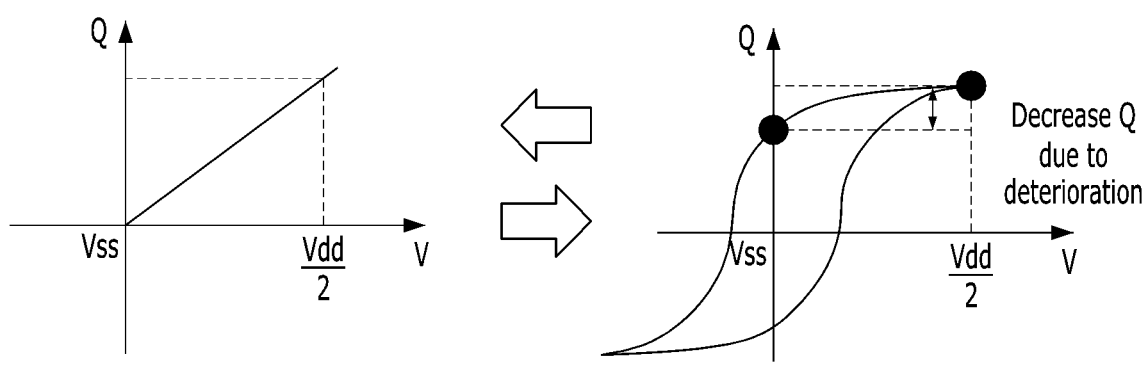
FIG. 15 is a graph showing hysteresis loop characteristics of a cell capacitor when switching between a DRAM operation and a FeRAM operation, in accordance with an embodiment of the present invention.

FIG. 14 is a detailed configuration diagram illustrating the control logic 130 of FIG. 1 in accordance with a second embodiment of the present invention. FIG. 15 is a graph showing hysteresis loop characteristics of a cell capacitor when switching between a DRAM operation and a FeRAM operation, in accordance with an embodiment of the present invention.

Referring to FIG. 14, the control logic 130 may include a command decoder 131, an address buffer 132, and an operational monitoring circuit 133.

Since the command decoder 131 and the address buffer 132 of FIG. 14 are substantially the same as those of FIG. 12, a detailed description thereof will be omitted.

The operational monitoring circuit 133 may generate the first sensing control signal SAEN1 and the second sensing control signal SAEN2, which are activated in response to the active command ACT and deactivated in response to the precharge command PCG. The operational monitoring circuit 133 may provide the first sensing control signal SAEN1 and the second sensing control signal SAEN2 by monitoring at least some of the memory cells MC which have a ferroelectric property or an anti-ferroelectric property. In particular, the operational monitoring circuit 133 according to the second embodiment of this invention may provide the first sensing control signal SAEN1 by detecting deteriorations of the memory cells MC based on the data DIN transmitted between the bit lines BL and the data lines DL, and may provide the second sensing control signal SAEN2 by detecting fails of memory cells MC based on the data DIN.

More specifically, the operational monitoring circuit 133 may include a fail detection circuit 340, a deterioration detection circuit 350, a mode determination circuit 360, and an operation control circuit 370.

The fail detection circuit 340 may generate a first detection signal DET1 based on the data DIN according to the first mode signal MD_D. The fail detection circuit 340 may be activated according to the first mode signal MD_D, and may activate the first detection signal DET1 by detecting a case where some bits of the data DIN continuously become a specific logical state.

Generally, a potential difference applied to both ends of the cell capacitor of DRAM is a half level (VDD/2) of the power supply voltage (VDD) level, or the ground voltage (VSS) level. A case where a potential difference of the half level occurs is referred to as a logical state '1', and a case where a potential difference of the ground voltage (VSS) level occurs is referred to as a logical state '0'. As illustrated in FIG. 15, since the cell capacitor of the DRAM has dielectric characteristics, an amount of charge generated according to a voltage shows a linear relationship. However, when the hysteresis of I-V Curve or C-V Curve occurs as the read/write operation is performed, the potential difference of the cell capacitor drops from the half level (VDD/2) to the ground voltage (VSS) level, and the amount of charge generated is much reduced compared to before. Accordingly, the logical state '1' cannot be detected normally and is always detected as the logical state '0'. In an embodiment of the present invention, when the first mode signal MD_D is activated, the fail detection circuit 340 may activate the first detection signal DET1 whenever it is detected that some bits of the data DIN read from the bit lines BL to the data lines DL continuously stay in a logical state '0'.

The deterioration detection circuit 350 may generate a second detection signal DET2 based on the data DIN according to the second mode signal MD_FE. The deterioration detection circuit 350 may be activated according to the second mode signal MD_FE, and may activate the second detection signal DET2 by detecting a case where some bits of the data DIN continuously stay in a specific logical state.

As illustrated in FIG. 15, the cell capacitor of FeRAM has hysteresis characteristics due to the presence of residual polarization or spontaneous polarization. However, the residual polarization may be reduced due to an access operation (e.g., a read or write operation, hereinafter, referred to as a normal operation) on the memory cells. Alternatively, it may decrease with the number of the access operations. If deterioration occurs in the ferroelectric of the cell capacitor, a voltage difference between the positive bit line BLT having a bias voltage (VREF) level and the negative bit line BLB having the ground voltage (VSS) level does not secure enough charge to sense the logic state '1'. Accordingly, the logical state '1' cannot be detected normally and is always detected as the logical state '0'. In an embodiment of the present invention, when the second mode signal MD_FE is activated, the deterioration detection circuit 350 may activate the second detection signal DET2 whenever it is detected that some bits of the data DIN read from the bit lines BL to the data lines DL continuously stay in a logical state '0'.

The mode determination circuit 360 may generate a first adjustment signal SET1 and the second mode signal MD_FE according to the first detection signal DET1, and generate a second adjustment signal SET2 and the first mode signal MD_D according to the second detection signal DET2.

In more detail, the mode determination circuit 360 may include a first determination circuit 362 and a second determination circuit 364. The first determination circuit 362 may activate the first adjustment signal SET1 whenever the first detection signal DET1 is activated, and may activate the second mode signal MD_FE when the number of activations of the first adjustment signal SET1 reaches a preset first number. The second determination circuit 364 may activate the second adjustment signal SET2 whenever the second detection signal DET2 is activated, and may activate the first mode signal MD_D when the number of activations of the second adjustment signal SET2 reaches a preset second number.

The operation control circuit 370 may generate the first sensing control signal SAEN1 and the second sensing control signal SAEN2, which are activated in response to the active command ACT and deactivated in response to the precharge command PCG, and may provide the first sensing control signal SAEN1 according to the first adjustment signal SET1 and the first mode signal MD_D, and provide the second sensing control signal SAEN2 according to the second adjustment signal SET2 and the second mode signal MD_FE.

In detail, the operation control circuit 370 may include a first operation circuit 372 and a second operation circuit 374.

When the first mode signal MD_D is activated, the first operation circuit 372 may output the first sensing control signal SAEN1 that is activated in response to the active command ACT and deactivated in response to the precharge command PCG while adjusting a level of the bit line precharge voltage VBLP to be decreased according to the first adjustment signal SET1. The first operation circuit 372 may provide the first sensing control signal SAEN1 to decrease the level of the bit line precharge voltage VBLP whenever the first adjustment signal SET1 is activated.

When the second mode signal MD_FE is activated, the second operation circuit 374 may output the second sensing control signal SAEN2 that is activated in response to the active command ACT and deactivated in response to the precharge command PCG while adjusting a level of the bias voltage VREF to be decreased according to the second adjustment signal SET2. The second operation circuit 374 may provide the second sensing control signal SAEN2 to decrease the level of the bias voltage VREF whenever the second adjustment signal SET2 is activated.

Figure 16:
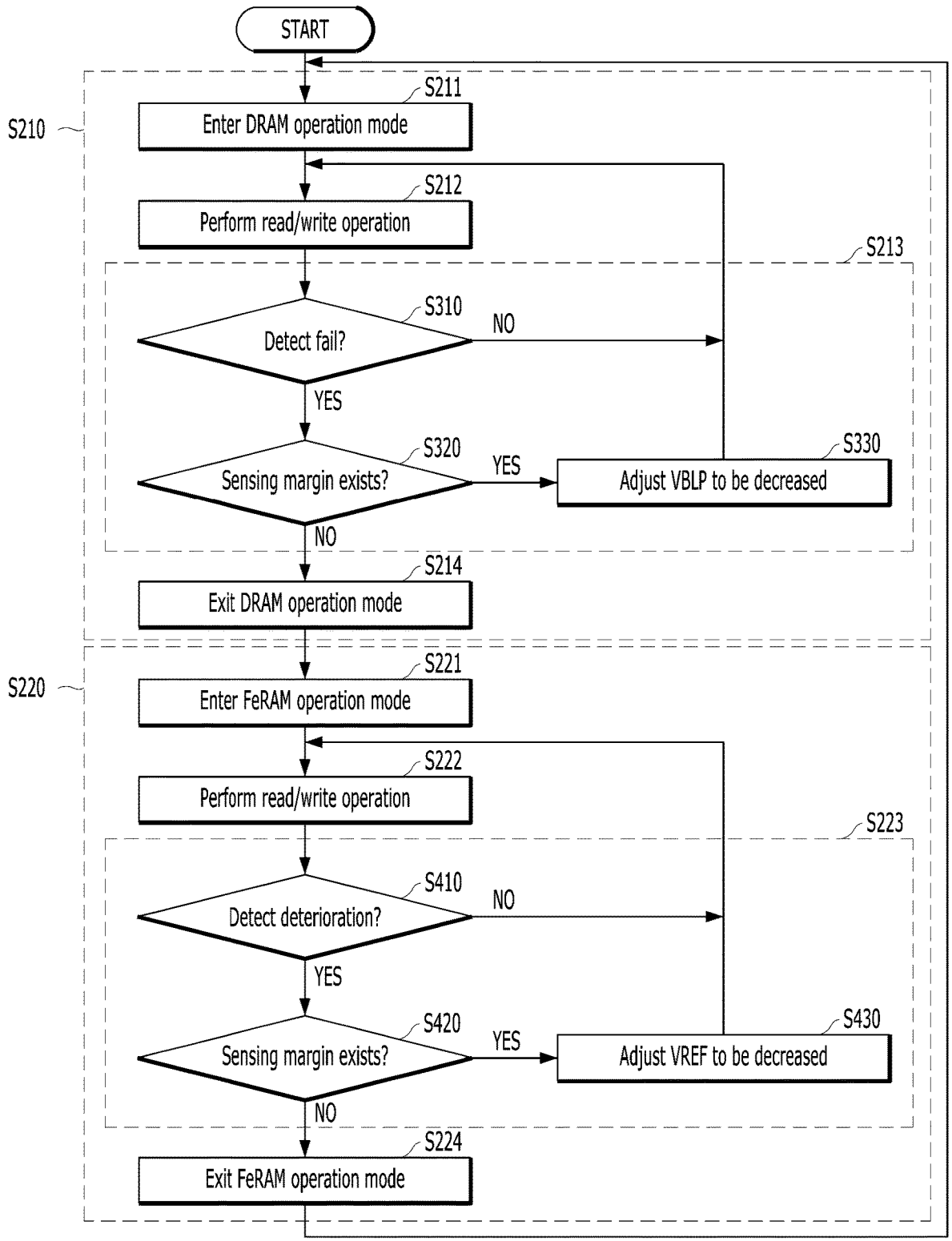
FIG. 16 is a flow chart for describing an operation of a memory device including the control logic of FIG. 14, in accordance with an embodiment of the present invention.

FIG. 16 is a flow chart for describing an operation of the memory device 100 including the control logic 130 of FIG. 14, in accordance with an embodiment of the present invention.

Referring to FIG. 16, the memory device 100 may repeatedly perform a DRAM operation S210 and a FeRAM operation S220 by monitoring whether memory cells MC have a ferroelectric property.

First, the memory device 100 may enter a DRAM operation mode (at operation S211). The first mode signal MD_D may be activated.

The control logic 130 may decode the command CMD to generate the active command ACT, the precharge command PCG, the read command RD, the write command WT and the like, and buffer the address ADD to generate the row address RADD and the column address CADD. The peripheral circuit 120 may perform an access operation such as a read/write operation to memory cells designated by the row address RADD and the column address CADD according to the active command ACT, the precharge command PCG, the read command RD, and the write command WT (at operation S212). At this time, the operation control circuit 330 may provide the first sensing control signal SAEN1 activated in response to the active command ACT and deactivated in response to the precharge command PCG.

Thereafter, the DRAM operation for detecting fails is performed (at operation S213).

First, the fail detection circuit 340 may generate the first detection signal DET1 based on the data DIN according to the first mode signal MD_D (at operation S310).

The fail detection circuit 340 may activate the first detection signal DET1 whenever it is detected that some bits of the data DIN read from the bit lines BL to the data lines DL continuously stay in the logical state '0' ("YES" in operation S310). When the first detection signal DET1 is not activated ("NO" of operation S310), the operations S212 to S310 may be repeatedly performed.

The first determination circuit 362 may activate the first adjustment signal SET1 when the first detection signal DET1 is activated. In this case, when the number of activations of the first adjustment signal SET1 does not reach the first number, the first determination circuit 362 may determine that there is a sensing margin ("YES" in operation S320) and maintain the first mode signal MD_D in an active state. The first control circuit 372 may provide the first sensing control signal SAEN1 to adjust the level of the bit line precharge voltage VBLP to be decreased according to the first control signal SET1. The common control circuit 212 of the sensing amplification circuit 123 may generate the first selection signal SEL1 as the first sensing control signal SAEN1 is activated, and the first voltage adjust circuit 216 may lower the level of the bit line precharge voltage VBLP according to the first selection signal SEL1 (at operation S330).

When the level of the bit line precharge voltage VBLP is adjusted to be decreased from the half level between the power supply voltage VDD and the ground voltage VSS, the potential difference of the memory cell during the charge sharing operation increases slightly. Since the potential difference is increased, a sufficient amount of charge required for the sensing operation may be secured. Thereafter, the memory device 100 may repeatedly perform the operations S211 to S213.

On the other hand, when some bits of the data DIN continuously stay in the logical state '0', the first adjustment signal SET1 is activated ("YES" in operation S310), and when the number of activations of the first adjustment signal SET1 reaches the first number, the first determination circuit 362 may determine that there is no sensing margin ("NO" in operation S320). The first determination circuit 362 may deactivate the first mode signal MD_D and activate the second mode signal MD_FE. Accordingly, the memory device 100 may exit the DRAM operation mode (at operation S214).

As the second mode signal MD_FE is activated, the memory device 100 may enter a FeRAM operation mode (at operation S221).

Likewise, the peripheral circuit 120 may perform an access operation such as a read/write operation on memory cells designated by the row address RADD and the column address CADD according to the active command ACT, the precharge command PCG, and the read command RD, and the write command WT (at operation S222). At this time, the operation control circuit 330 may provide the second sensing control signal SAEN2 that is activated in response to the active command ACT and deactivated in response to the precharge command PCG.

The deterioration detection circuit 350 may activate the second detection signal DET2 whenever it is detected that some bits of the data DIN continuously stay in a logical state '0' ("YES" in operation S410). When the second detection signal DET2 is not activated ("NO" of S410), the operations S222 to S410 may be repeatedly performed.

The second determination circuit 364 may activate the second adjustment signal SET2 when the second detection signal DET2 is activated. In this case, when the number of activations of the second adjustment signal SET2 does not reach the second number, the second determination circuit 364 may determine that there is a sensing margin ("YES" in operation S420) and maintain the second mode signal MD_FE in an active state. The second control circuit 374 may provide the second sensing control signal SAEN2 to adjust the level of the bias voltage VREF to be decreased according to the second control signal SET2. The second control circuit 214 of the sense amplification circuit 123 may generate the second selection signal SEL2 as the second sensing control signal SAEN2 is activated, and the second voltage control circuit 217 may lower the level of the bias voltage VREF according to the second selection signal SEL2 (at operation S430).

When the level of the bias voltage VREF is adjusted to be decreased from the intermediate level between the bit line precharge voltage VBLP and the ground voltage VSS, a voltage level applied to the negative bit line BLB during the charge sharing operation is lowered, increasing the voltage difference between the positive bit line BLT and the negative bit line BLB. Since the potential difference is increased, a sufficient amount of charge required for the sensing operation may be secured. Thereafter, the memory device 100 may repeatedly perform the operations S221 to S223. Depending on an embodiment, instead of lowering the level of the bias voltage VREF, the sensing amplification circuit 123 may adjust a slew rate of at least one of the first and second bias control signals ENL and ENR.

On the other hand, when some bits of the data DIN are detected to continuously stay in the logical state '0', the second adjustment signal SET3 is activated ("YES" in operation S410), and when the second adjustment signal SET2 reaches the second number of activations, the second determination circuit 364 may determine that there is no sensing margin ("NO" in operation S420). The second determination circuit 364 may deactivate the second mode signal MD_FE and activate the first mode signal MD_D. Accordingly, the memory device 100 may exit the FeRAM operation mode (at operation S224), to have no additional sensing margin (NO, MD_FE mode of S420). Accordingly, the ferroelectric memory (FeRAM) operation mode may be terminated (at operation S224).

As described above, the memory device 100 may perform the DRAM operation S210 based on a result of detecting the deteriorations of the memory cells, and the FeRAM operation S220 based on a result of detecting the failure of the memory cells.

Figure 17:
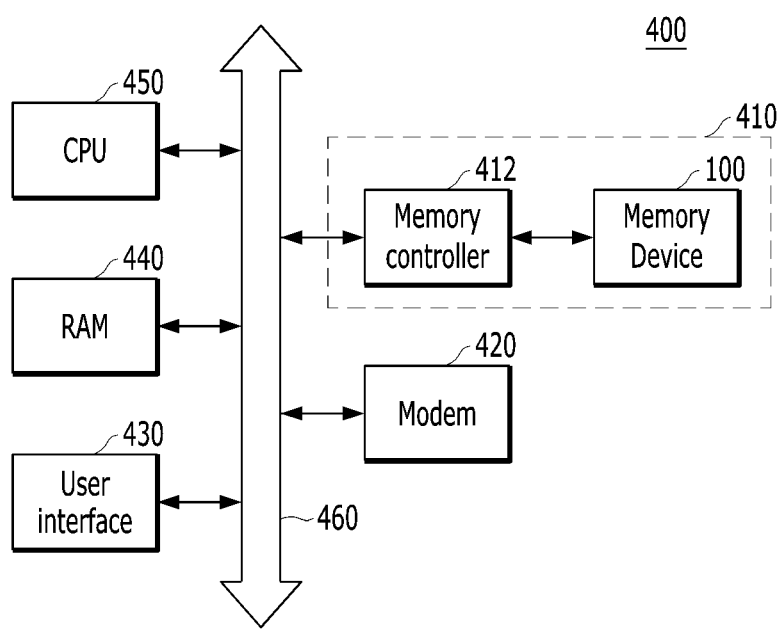
FIG. 17 is a block diagram of an information processing system to which a memory device according to an embodiment of the present invention is applied.

FIG. 17 is a block diagram of an information processing system 400 to which a memory device according to an embodiment of the present invention is applied.

Referring to FIG. 17, on the information processing system 400 such as a mobile device or a desktop computer, the memory device 100 or a memory system 410 including the same according to embodiments of the present invention may be mounted. The information processing system 400 may include the memory system 410, a modem 420, a central processing unit 450, a RAM 440, and a user interface 430 electrically coupled to a system bus 460. Also, the memory system 410 may be a nonvolatile memory system including a nonvolatile memory, and for example, the memory system 410 may include the memory device 100 and a memory controller 412. The memory device 100 of FIG. 17 may perform the same configuration and operation as the ferroelectric memory device 100 described in FIGS. 1 to 16.

The memory system 410 may store data processed by the central processing unit 450 or data input from the outside. Although not shown in FIG. 17, the information processing system 400 may further include an application chipset, a camera image processor (CIS), an input/output device, and the like.

Various embodiments of the present disclosure have been described in the drawings and specification. Although specific terminologies are used here, the terminologies are only to describe the embodiments of the present disclosure. Therefore, the present disclosure is not restricted to the above-described embodiments and many variations are possible within the spirit and scope of the present disclosure. It should be apparent to those skilled in the art that various modifications can be made based on the technological scope of the present disclosure in addition to the embodiments disclosed herein. The embodiments may be combined to form additional embodiments.

It should be noted that although the technical spirit of the disclosure has been described in connection with embodiments thereof, this is merely for description purposes and should not be interpreted as limiting. It should be appreciated by one of ordinary skill in the art that various changes may be made thereto without departing from the technical spirit of the disclosure and the following claims.

For example, for the logic gates and transistors provided as examples in the above-described embodiments, different positions and types may be implemented depending on the polarity of the input signal. Furthermore, the embodiments may be combined to form additional embodiments.

What is claimed is:

1. A memory device comprising:
a memory cell array including a plurality of memory cells;
a sense amplifying circuit configured to sense data of the memory cells through bit lines, the sense amplifying circuit including:
a first operational circuit configured to perform a first operation according to a first sensing control signal; and
a second operational circuit configured to perform a second operation according to a second sensing control signal; and
an operational monitoring circuit configured to provide the first sensing control signal or the second sensing control signal by monitoring whether at least some of the memory cells have a ferroelectric property based on at least any of numbers of accesses to the respective memory cells in each of the first operation and the second operation, and a consistent value status of data stored in at least a part of the memory cells in each of the first operation and the second operation.

2. The memory device of claim 1,
wherein the first operation includes an offset cancellation operation for a dynamic random access memory (DRAM), the offset cancellation operation being an operation of removing a mismatch between the bit lines before sensing the data, and
wherein the second operation includes a recovery operation for a ferroelectric RAM (FeRAM), the recovery operation being an operation of applying a bias voltage to some of the bit lines before sensing the data.

3. The memory device of claim 1, wherein each of the memory cells includes:
a cell capacitor including a first electrode coupled to a plate line; and
an access transistor coupled between a second electrode of the cell capacitor and a corresponding bit line and including a gate coupled to a word line.

4. The memory device of claim 3, wherein the cell capacitor further includes a dielectric material having a ferroelectric property or an anti-ferroelectric property according as the first operation or the second operation is performed.

5. The memory device of claim 1,
wherein the sense amplifying circuit further includes a plurality of bit line sense amplifiers respectively coupled to a positive bit line and a negative bit line among the bit lines, and
wherein each of the bit line sense amplifiers includes:
the first operational circuit configured to electrically couple, before a sensing operation, a first inner bit line and the negative bit line to each other and a second inner bit line and the positive bit line to each other according to the first sensing control signal; and
the second operational circuit configured to apply, before the sensing operation, a bias voltage to one of the first inner bit line and the second inner bit line according to the second sensing control signal.

6. The memory device of claim 5, wherein each of the bit line sense amplifiers further includes:
a pull-up circuit including first and second pull-up transistors respectively coupled between a pull-up power line and the first and second inner bit lines, the pull-up circuit being arranged in a cross-coupled structure;
a pull-down circuit including first and second pull-down transistors respectively coupled between the first and second inner bit lines and the pull-down power line; and
an isolation circuit configured to couple, during the sensing operation, the positive bit line and the first inner bit line to each other and the second inner bit line and the negative bit line to each other according to the first sensing control signal or the second sensing control signal.

7. The memory device of claim 1, wherein the operational monitoring circuit includes:
an access counter configured to generate access counting values for the respective memory cells by counting the numbers of accesses to the respective memory cells based on a command and an address, the access counter being initialized by a counting reset signal;
a mode determination circuit configured to:
activate a second mode signal by comparing each of the access counting values and a first threshold value with each other,
activate a first mode signal by comparing each of the access counting values and a second threshold value with each other, and
activate the counting reset signal when the first mode signal or the second mode signal is activated; and
an operation control circuit configured to:
generate the first sensing control signal and the second sensing control signal according to the command,
provide the first sensing control signal according to the first mode signal, and
provide the second sensing control signal according to the second mode signal.

8. The memory device of claim 7, wherein the mode determination circuit is configured to:
deactivate the first mode signal and activate the second mode signal when a predetermined number of ones among the access counting values individually exceed the first threshold value in a state that the first mode signal is activated, and
deactivate the second mode signal and activate the first mode signal when a predetermined number of ones among the access counting values individually exceed the second threshold value in a state that the second mode signal is activated.

9. The memory device of claim 1, wherein the operational monitoring circuit includes:
a fail detection circuit configured to generate, according to a first mode signal, a first detection signal based on the data;
a deterioration detection circuit configured to generate, according to a second mode signal, a second detection signal based on the data;
a mode determination circuit configured to:
generate a first adjustment signal and the second mode signal according to the first detection signal, and
generate a second adjustment signal and the first mode signal according to the second detection signal; and
an operation control circuit configured to:
generate the first sensing control signal and the second sensing control signal according to a command,
provide the first sensing control signal according to the first adjustment signal and the first mode signal, and
provide the second sensing control signal according to the second adjustment signal and the second mode signal.

10. The memory device of claim 9, wherein the mode determination circuit includes:
a first determination circuit configured to:
activate the first adjustment signal whenever the first detection signal is activated, and
activate the second mode signal when a number of activations of the first adjustment signal reaches a preset first number; and
a second determination circuit configured to:
activate the second adjustment signal whenever the second detection signal is activated, and
activate the first mode signal when a number of activations of the second adjustment signal reaches a preset second number.

11. The memory device of claim 9, wherein the operation control circuit includes:
a first operation circuit configured to output the first sensing control signal and decrease a level of a bit line precharge voltage according to the first adjustment signal, when the first mode signal is activated; and
a second operation circuit configured to output the second sensing control signal and decrease a level of a bias voltage according to the second adjustment signal, when the second mode signal is activated.

12. A memory device comprising:
a memory cell array including a plurality of memory cells;
a sense amplifying circuit configured to sense data of the memory cells through bit lines, the sense amplifying circuit including:
a first operational circuit configured to perform a first operation according to a first sensing control signal; and
a second operational circuit configured to perform a second operation according to a second sensing control signal; and
an operational monitoring circuit configured to:
generate access counting values for the respective memory cells by counting numbers of accesses to the respective memory cells based on a command and an address, and
provide the first sensing control signal or the second sensing control signal based on the access counting values.

13. The memory device of claim 12, wherein each of the memory cells includes:
a cell capacitor including a first electrode coupled to a plate line; and
an access transistor coupled between a second electrode of the cell capacitor and a corresponding bit line and including a gate coupled to a word line.

14. The memory device of claim 12,
wherein the sense amplifying circuit includes a plurality of bit line sense amplifiers respectively coupled to a positive bit line and a negative bit line among the bit lines, and
wherein each of the bit line sense amplifiers includes:
the first operational circuit configured to electrically couple, before a sensing operation, a first inner bit line and the negative bit line to each other and a second inner bit line and the positive bit line to each other according to the first sensing control signal; and
the second operational circuit configured to apply, before the sensing operation, a bias voltage to one of the first inner bit line and the second inner bit line according to the second sensing control signal.

15. The memory device of claim 14, wherein the operational monitoring circuit includes:
an access counter configured to generate the access counting values based on the command and the address, the access counter being initialized by a counting reset signal;
a mode determination circuit configured to:
activate a second mode signal by comparing each of the access counting values and a first threshold value with each other, activate a first mode signal by comparing each of the access counting values and a second threshold value with each other, and activate the counting reset signal when the first mode signal or the second mode signal is activated; and an operation control circuit configured to:

generate the first sensing control signal according to the first mode signal, and generate the second sensing control signal according to the second mode signal.

16. The memory device of claim 15, wherein the mode determination circuit is configured to:

deactivate the first mode signal and activate the second mode signal when a predetermined number of ones among the access counting values individually exceed the first threshold value in a state that the first mode signal is activated, and deactivate the second mode signal and activate the first mode signal when a predetermined number of ones among the access counting values individually exceed the second threshold value in a state that the second mode signal is activated.

17. A memory device comprising:

a memory cell array including a plurality of memory cells;

a sense amplifying circuit configured to sense data of the memory cells through bit lines, the sense amplifying circuit including:

a first operational circuit configured to perform a first operation according to a first sensing control signal; and a second operational circuit configured to perform a second operation according to a second sensing control signal; and an operational monitoring circuit configured to:

provide the first sensing control signal by detecting deteriorations of the memory cells based on the data, and provide the second sensing control signal by detecting fails of memory cells based on the data.

18. The memory device of claim 17, wherein each of the memory cells includes:

a cell capacitor including a first electrode coupled to a plate line; and an access transistor coupled between a second electrode of the cell capacitor and a corresponding bit line and including a gate coupled to a word line.

19. The memory device of claim 17, wherein the sense amplifying circuit includes a plurality of bit line sense amplifiers respectively coupled to a positive bit line and a negative bit line among the bit lines, and wherein each of the bit line sense amplifiers includes:

the first operational circuit configured to electrically couple, before a sensing operation, a first inner bit line and the negative bit line to each other and a second inner bit line and the positive bit line to each other according to the first sensing control signal; and the second operational circuit configured to apply, before the sensing operation, a bias voltage to one of the first inner bit line and the second inner bit line according to the second sensing control signal.

20. The memory device of claim 17, wherein the operational monitoring circuit includes:

a fail detection circuit configured to generate, according to a first mode signal, a first detection signal based on the data;

a deterioration detection circuit configured to generate, according to a second mode signal, a second detection signal based on the data;

a mode determination circuit configured to:

generate a first adjustment signal and the second mode signal according to the first detection signal, and generate a second adjustment signal and the first mode signal according to the second detection signal; and an operation control circuit configured to:

provide the first sensing control signal according to the first adjustment signal and the first mode signal, and provide the second sensing control signal according to the second adjustment signal and the second mode signal.

21. The memory device of claim 20, wherein the mode determination circuit includes:

a first determination circuit configured to:

activate the first adjustment signal whenever the first detection signal is activated, and activate the second mode signal when a number of activations of the first adjustment signal reaches a preset first number; and a second determination circuit configured to:

activate the second adjustment signal whenever the second detection signal is activated, and activate the first mode signal when a number of activations of the second adjustment signal reaches a preset second number.

22. The memory device of claim 20, wherein the operation control circuit includes:

a first operation circuit configured to output the first sensing control signal and decrease a level of a bit line precharge voltage according to the first adjustment signal, when the first mode signal is activated; and a second operation circuit configured to output the second sensing control signal and decrease a level of a bias voltage according to the second adjustment signal, when the second mode signal is activated.

* * * * *